(12) United States Patent
Bok et al.

(10) Patent No.: US 12,147,635 B2
(45) Date of Patent: Nov. 19, 2024

(54) ELECTRONIC PANEL AND ELECTRONIC DEVICE INCLUDING THE SAME

(71) Applicant: Samsung Display Co., Ltd., Yongin-si (KR)

(72) Inventors: Seung-lyong Bok, Hwaseong-si (KR); Jungkyu Lee, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 17/486,836

(22) Filed: Sep. 27, 2021

(65) Prior Publication Data

US 2022/0011908 A1 Jan. 13, 2022

Related U.S. Application Data

(63) Continuation of application No. 16/888,165, filed on May 29, 2020, now Pat. No. 11,132,098.

(30) Foreign Application Priority Data

Jun. 26, 2019 (KR) .......................... 10-2019-0076320

(51) Int. Cl.
*G06F 3/044* (2006.01)
*G06F 3/041* (2006.01)
*H10K 59/40* (2023.01)

(52) U.S. Cl.
CPC ........ *G06F 3/0446* (2019.05); *G06F 3/04164* (2019.05); *G06F 3/0443* (2019.05); *H10K 59/40* (2023.02)

(58) Field of Classification Search
None
See application file for complete search history.

(56) References Cited

U.S. PATENT DOCUMENTS

| 7,489,066 | B2 | 2/2009 | Scott et al. |
| 8,094,134 | B2 | 1/2012 | Suzuki et al. |
| 8,698,777 | B2 | 4/2014 | Endo et al. |
| 8,934,228 | B2 | 1/2015 | Franklin et al. |
| 9,430,180 | B2 | 8/2016 | Hirakata et al. |
| 9,696,223 | B2 | 7/2017 | Lisseman et al. |
| 10,394,069 | B2 * | 8/2019 | Yamazaki ............ G02B 5/3016 |
| 10,739,919 | B2 | 8/2020 | Moon et al. |
| 11,340,747 | B1 * | 5/2022 | Lin ....................... G06F 3/0445 |

(Continued)

FOREIGN PATENT DOCUMENTS

| JP | 2015-118373 A | 6/2015 |
| KR | 10-2016-0097440 A | 8/2016 |

(Continued)

*Primary Examiner* — Amare Mengistu
*Assistant Examiner* — Sarvesh J Nadkarni
(74) *Attorney, Agent, or Firm* — Lewis Roca Rothgerber Christie LLP

(57) ABSTRACT

An electronic panel includes: a base substrate; a first sensor including a first sensing electrode on the base substrate, a second sensing electrode spaced apart from the first sensing electrode, a first sensing line connected to the first sensing electrode, and a second sensing line connected to the second sensing electrode; and a second sensor including an additional sensing electrode spaced apart from the first sensing electrode and the second sensing electrode, wherein the additional sensing electrode overlaps the first sensing line on a plane.

21 Claims, 22 Drawing Sheets

(56) References Cited

U.S. PATENT DOCUMENTS

| | | |
|---|---|---|
| 11,666,273 B2* | 6/2023 | Wilson .................. G01J 1/0474 250/208.1 |
| 2014/0139447 A1 | 5/2014 | Kang et al. |
| 2015/0070305 A1 | 3/2015 | Seo et al. |
| 2015/0138041 A1* | 5/2015 | Hirakata .................. G09G 5/14 345/1.3 |
| 2015/0144934 A1* | 5/2015 | Rappoport ............ G06F 1/1641 257/40 |
| 2015/0160754 A1* | 6/2015 | Wenzel ............ G06F 3/041662 345/174 |
| 2015/0212548 A1 | 7/2015 | Namkung et al. |
| 2016/0170523 A1 | 6/2016 | Park et al. |
| 2016/0172428 A1 | 6/2016 | Song et al. |
| 2016/0216841 A1 | 7/2016 | Gotoh et al. |
| 2016/0232395 A1* | 8/2016 | Han ...................... G06F 1/1626 |
| 2017/0024047 A1 | 1/2017 | Kung |
| 2017/0031529 A1 | 2/2017 | Chen et al. |
| 2017/0185205 A1 | 6/2017 | Lu et al. |
| 2017/0236877 A1 | 8/2017 | Jeong |
| 2017/0277310 A1 | 9/2017 | Xiong et al. |
| 2017/0285844 A1 | 10/2017 | Park et al. |
| 2017/0293377 A1 | 10/2017 | Hsu et al. |
| 2017/0329511 A1 | 11/2017 | Ueno et al. |
| 2017/0371190 A1 | 12/2017 | Yamazaki et al. |
| 2017/0371452 A1 | 12/2017 | Endo et al. |
| 2018/0039370 A1 | 2/2018 | Lu et al. |
| 2018/0053813 A1 | 2/2018 | Choi et al. |
| 2018/0157361 A1 | 6/2018 | Kim |
| 2018/0188838 A1 | 7/2018 | An et al. |
| 2018/0374425 A1 | 12/2018 | Jeong et al. |
| 2019/0004648 A1 | 1/2019 | Xu et al. |
| 2019/0012000 A1 | 1/2019 | Cavallaro et al. |
| 2019/0146621 A1 | 5/2019 | Aoki et al. |
| 2019/0252412 A1 | 8/2019 | An et al. |
| 2020/0026422 A1 | 1/2020 | Seomoon et al. |
| 2020/0241664 A1 | 7/2020 | Lee et al. |
| 2020/0265208 A1* | 8/2020 | Wang .................... G06V 10/22 |
| 2021/0013285 A1* | 1/2021 | Hsieh .................... H10K 59/00 |
| 2021/0294460 A1* | 9/2021 | Yang .................... G06F 3/04164 |
| 2023/0078619 A1* | 3/2023 | Chai .................... G06F 3/0445 345/174 |

FOREIGN PATENT DOCUMENTS

| | | |
|---|---|---|
| KR | 10-1866395 B1 | 6/2018 |
| KR | 10-2019-0000022 A | 1/2019 |
| KR | 10-2019-0020213 A | 2/2019 |

* cited by examiner

ELECTRONIC PANEL AND ELECTRONIC DEVICE INCLUDING THE SAME

CROSS-REFERENCE TO RELATED APPLICATIONS

This application is a continuation of U.S. patent application Ser. No. 16/888,165, filed May 29, 2020, which claims priority to and the benefit of Korean Patent Application No. 10-2019-0076320, filed Jun. 26, 2019, the entire content of both of which is incorporated herein by reference.

BACKGROUND

1. Field

The present disclosure relate to an electronic panel and an electronic device including the electronic panel.

2. Description of the Related Art

An electronic device may be activated by receiving an electrical signal. The electronic device may further include a display unit for displaying an image and/or an sensor for sensing an external input applied from the outside (e.g., a touch input). The external input may be provided in various forms such as touch, pressure, light, or heat.

The electronic device may include various conductive patterns to be activated by an electrical signal. The area in which the conductive patterns are activated displays information or responds to external inputs applied from the outside. The electronic device may sense an applied external input applied, and provide information on the external input to a user, or may drive various applications based on the information. As applications become more diverse, the need for external input sensing at various positions in electronic devices is increasing.

The above information disclosed in this Background section is only for enhancement of understanding of the background and therefore the information discussed in this Background section does not necessarily constitute prior art.

SUMMARY

Aspects of some example embodiments of the present disclosure relate to an electronic panel and an electronic device including the electronic panel, and for example, to an electronic device capable of sensing an external input and a driving method thereof.

Aspects of some example embodiments of the present disclosure may include an electronic device capable of sensing an external input provided at various positions.

In an embodiment of the inventive concept, an electronic panel includes: a base substrate; a first sensor including a first sensing electrode on the base substrate, a second sensing electrode spaced from the first sensing electrode, a first sensing line connected to the first sensing electrode, and a second sensing line connected to the second sensing electrode; and a second sensor including an additional sensing electrode spaced from the first sensing electrode and the second sensing electrode, wherein the additional sensing electrode overlaps the first sensing line on a plane.

In an embodiment, the first sensing electrodes may include first sensing patterns on the same layer and spaced apart from each other and a first connection pattern connecting the first sensing patterns, wherein the second sensing electrode may include second sensing patterns on the same layer and spaced apart from each other and a second connection pattern on a different layer than the first connection pattern and connecting the second sensing patterns, wherein the additional sensing electrode may be on the same layer as any one of the first connection pattern and the second connection pattern.

In an embodiment, the first sensing line may be on the same layer as the other of the first connection pattern and the second connection pattern.

In an embodiment, the electronic panel may further include a shield electrode overlapping the first sensing patterns and the second sensing patterns on a plane and on the same layer as the first connection pattern, wherein an opening part may be defined in the shielding electrode, wherein the first connection pattern may be within the opening part.

In an embodiment, the base substrate may include a main part including a main active area and a cut-out part bent from the main part and including a sub-active area, wherein the first sensing electrode and the second sensing electrode may be in the main active area and the additional sensing electrode may be in the sub-active area.

In an embodiment, the main part and the cut-out part may be perpendicular.

In an embodiment, the cut-out part may include a curved surface.

In an embodiment, the electronic panel may further include a plurality of pixels on the base substrate, wherein a part of the pixels may be in the main active area and the other part of the pixels may be arranged in the sub-active area.

In an embodiment, the cut-out part may be provided in plurality, and the cut-out parts are connected to edges of the main part, respectively, and are bent from the cut-out parts, respectively.

In an embodiment of the inventive concept, an electronic device includes: a display unit including a plurality of pixels; and an sensor on the display unit and configured to sense an external input, wherein the sensor is on the display unit and includes: a first sensor including a first sensing electrode, a second sensing electrode spaced from the first sensing electrode, a first sensing line connected to the first sensing electrode and a second sensing line connected to the second sensing electrode; and a second sensor including an additional sensing electrode spaced on a plane from the first sensing electrode and the second sensing electrode, and an additional sensing line on the same layer as the additional sensing electrode and connected to the additional sensing electrode, wherein the second sensor is on the same layer as at least one of the configurations of the first input sensor.

In an embodiment, the first sensing electrode may include a first sensing pattern and a first connection pattern connected to the first sensing pattern, wherein the second sensing electrode may include a second sensing pattern spaced apart from the first sensing pattern and a second connection pattern on a different layer than the first connection pattern and connected to the second sensing pattern, wherein the additional sensing electrode may be on the same layer as any one of the first connection pattern and the second connection pattern.

In an embodiment, the first sensing line and the second sensing line may be on the same layer as the other of the first connection pattern and the second connection pattern.

In an embodiment, the additional sensing electrode may overlap with at least one of the first sensing line or the second sensing line.

In an embodiment, the display unit may include: a main part configured to display an image toward a first direction; and a cut-out part bent from the main part and configured to display an image toward a second direction different from the first direction, wherein the first sensing electrode and the second sensing electrode may be in the main part and the additional sensing electrode may be on the cut-out part.

In an embodiment, the electronic device may further include a shield electrode on the main part and on the same layer as the second input sensor, wherein the shield electrode may be electrically insulated from the first input sensor.

In an embodiment, the electronic device may further include an electronic module overlapping on the main part, wherein a hole overlapping the electronic module and penetrating the main part may be defined in the display unit, wherein the second sensor may further include a hole addition sensing electrode along an edge of the hole.

In an embodiment, the electronic device may further include a planarization layer between the display unit and the sensor and configured to cover the display unit along an edge of the hole, wherein the second sensor may be on the planarization layer.

In an embodiment, the planarization layer may further include a plurality of conductive nanoparticles.

In an embodiment, the cut-out part may be provided in a plurality spaced apart from each other, and the cut-out parts may be connected to edges of the main part and are bent from the main part.

In an embodiment, the additional sensing electrode may be driven by a self-capacitance type or a mutually capacitive type.

In an embodiment of the inventive concept, an electronic device includes: a base substrate including a main part and a bending part bent from the main part; a first sensing electrode including a plurality of first sensing patterns on the main part and a plurality of first connection patterns on the main part to connect the first sensing patterns; a second sensing electrode including a plurality of second sensing patterns on the main part and spaced apart from the first sensing patterns, and a plurality of second connection patterns on the main part and connecting the second sensing patterns; and a third sensing electrode in the bending part and spaced apart from the first sensing patterns and the second sensing patterns, wherein the third sensing electrode includes the same material as the first connection patterns, and is on the same layer as the first connection patterns.

In an embodiment, the first connection patterns may be on a different layer than the second connection patterns.

In an embodiment, the electronic device may further include: a first sensing line connected to the first sensing electrode; a second sensing line connected to the second sensing electrode; and a third sensing line connected to the third sensing electrode, wherein the first sensing line and the second sensing line may be on the same layer as the first connection patterns.

In an embodiment, the first sensing line and the second sensing line may be on the bending part, wherein the third sensing electrode may overlap with at least one of the first sensing line or the second sensing line on a plane.

In an embodiment, at least one of the first sensing patterns or the second sensing patterns may be overlapping the bending part.

In an embodiment, the bending part may include: a first bending part bent from one side of the main part; and a second bending part bent from the other side of the main part and spaced apart from the first bending part with the main part therebetween, wherein the third sensing electrode may be provided in a plurality and may be on each of the first bending part and the second bending part.

In an embodiment, a bending angle of the first bending part with respect to the main part may be equal to a bending angle of the second bending part with respect to the main part.

BRIEF DESCRIPTION OF THE DRAWINGS

The accompanying drawings are included to provide a further understanding of the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Figure 1A:
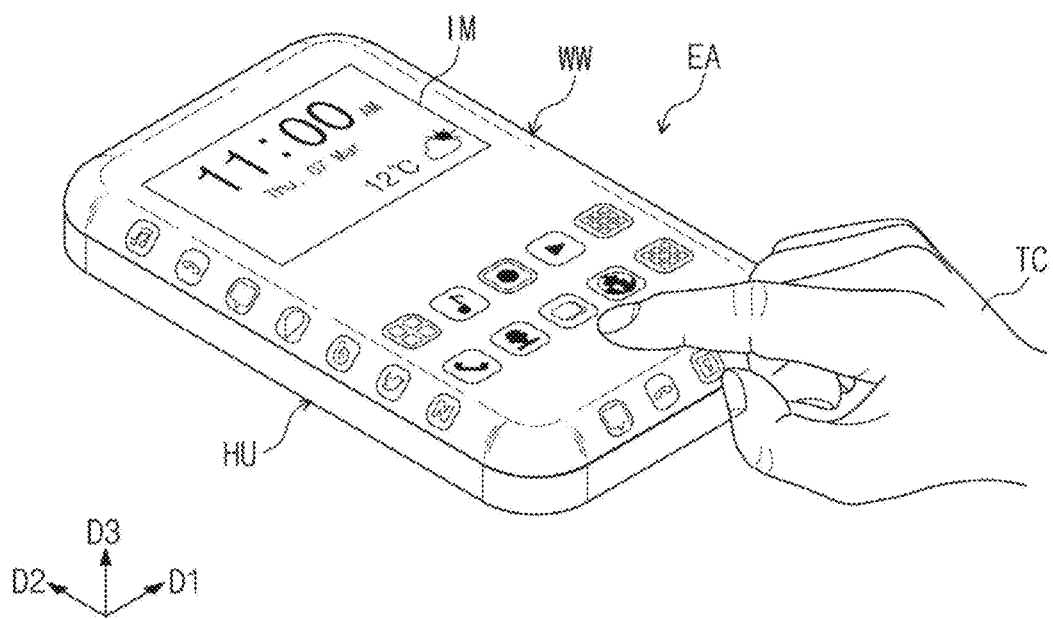
FIG. 1A is an assembled perspective view of an electronic device according to an embodiment of the inventive concept.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, another embodiment of the inventive concept will be described with reference to the drawings.

Figure 1B:
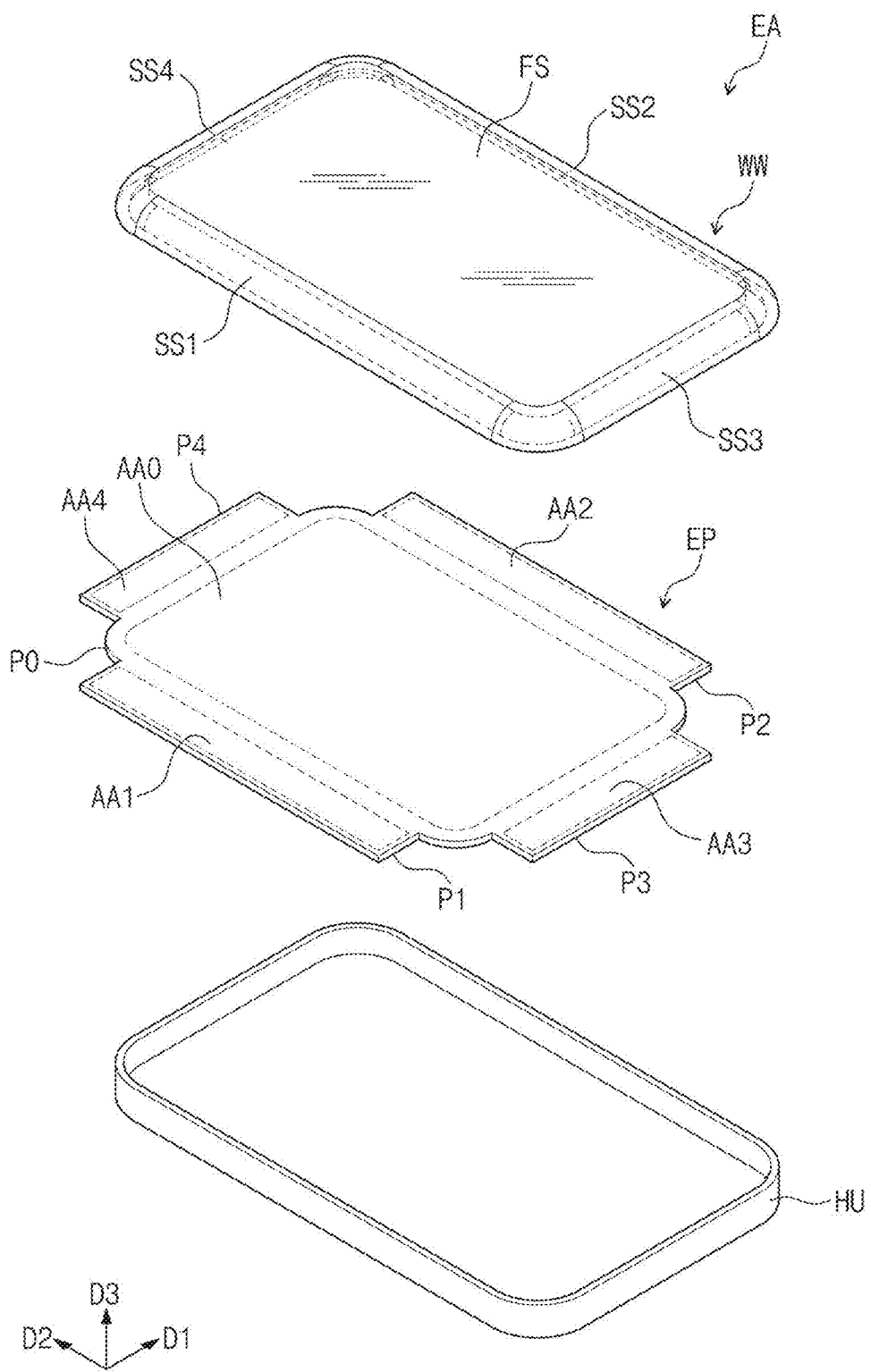
FIG. 1B is an exploded perspective view of the electronic device shown in FIG. 1A.
Figure 2A:
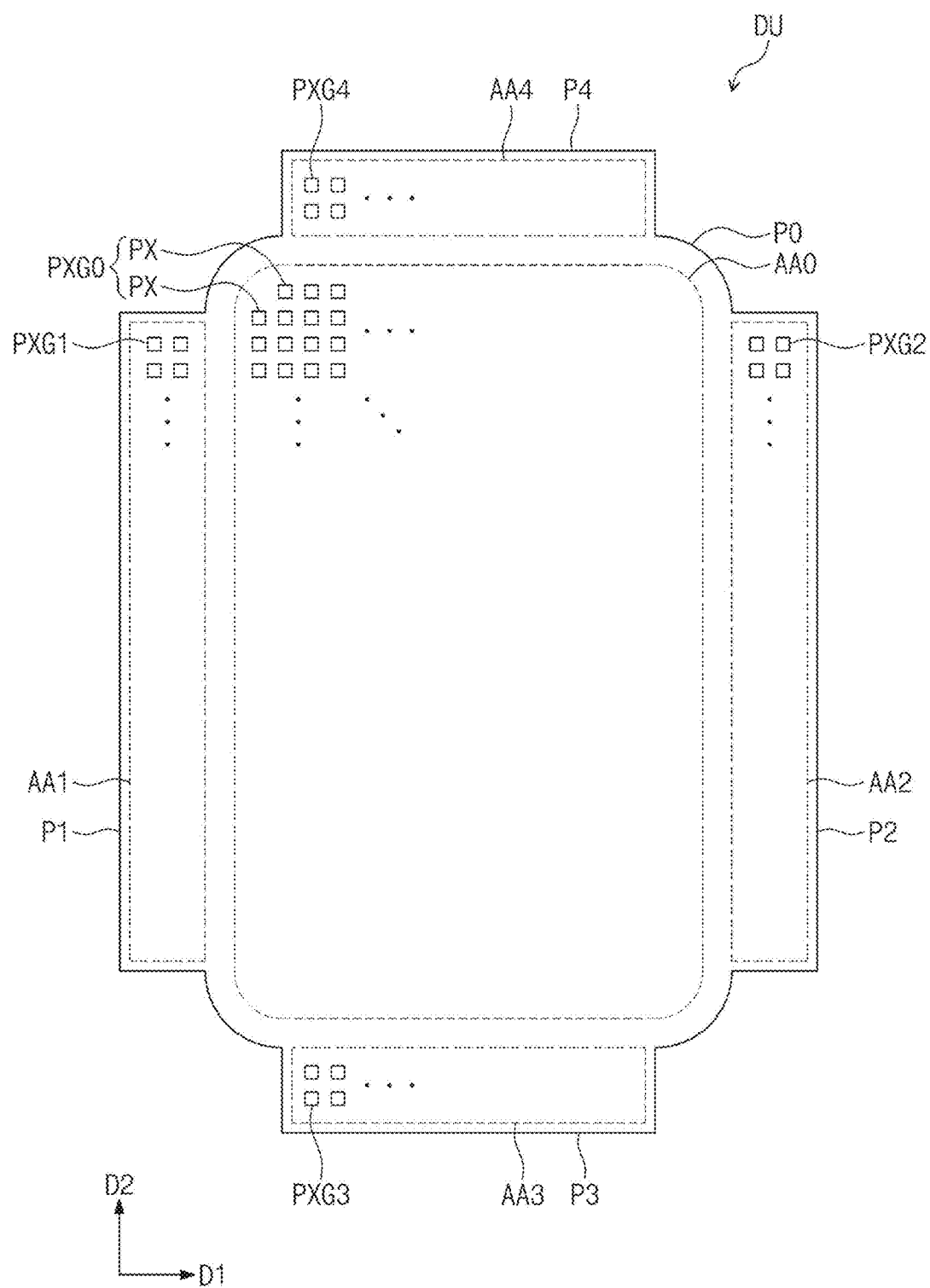
FIGS. 2A to 2C are plan views showing a part of the configuration of an electronic panel according to an embodiment of the inventive concept.
Figure 2B:
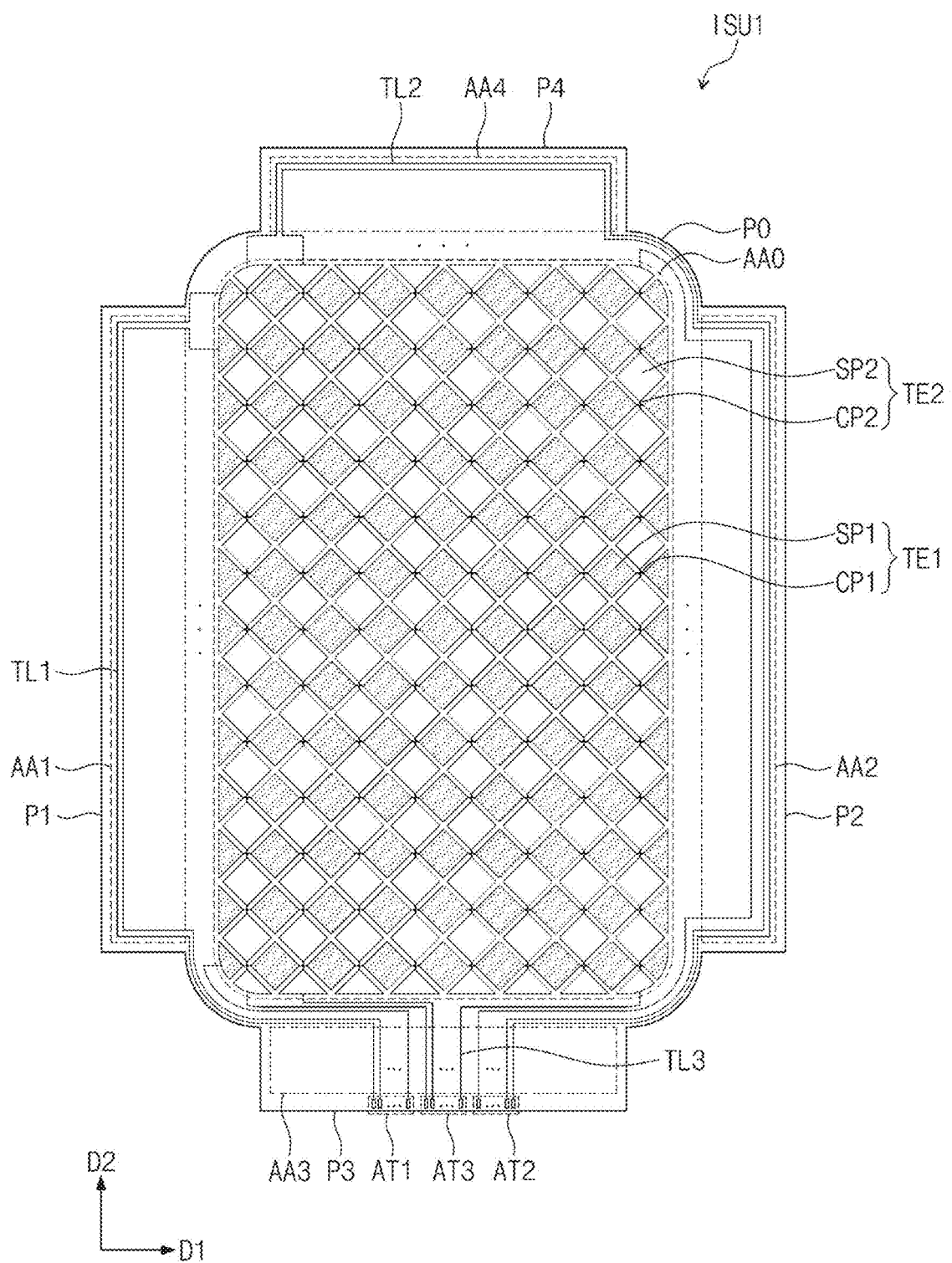
Figure 2C:
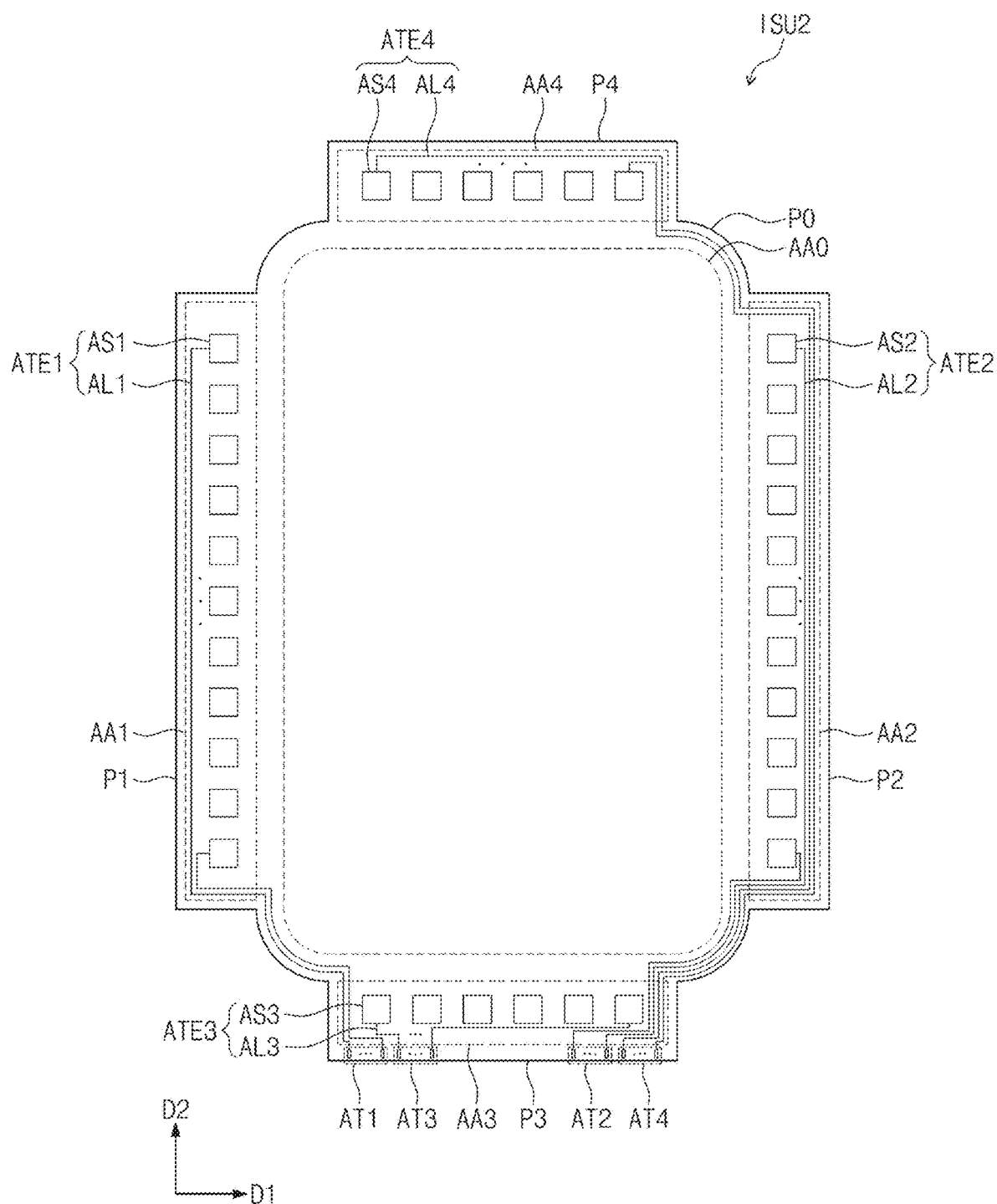

FIG. 1A is an assembled perspective view of an electronic device according to an embodiment of the inventive concept. FIG. 1B is an exploded perspective view of the electronic device shown in FIG. 1A. FIGS. 2A to 2C are plan views showing a part of the configuration of an electronic panel according to an embodiment of the inventive concept. Hereinafter, the inventive concept will be described in more detail with reference to FIGS. 1A to 2C.

The electronic device EA may display the image IM and sense an externally applied input TC of a user.

The image IM may be displayed on all surfaces of the window WW. For example, the image IM may be displayed on each of the front surface FS and the plurality of side surfaces SS1, SS2, SS3 and SS4 of the window WW.

The user's input TC (hereinafter referred to as an external input) includes various types of external inputs such as a part of the user's body, light, heat, or pressure, or from an external object, such as a stylus. In addition, the electronic device EA may sense inputs that contact and also are close to or adjacent to the electronic device EA. That is, according to an embodiment, the electronic device EA may sense input by external objects (e.g., a user's finger, a stylus, etc.) which are in close proximity (e.g., within a set or predetermined threshold distance) to the electronic device EA. In FIGS. 1A and 1B, the electronic device EA is shown as a smartphone and the external input TC is shown with the user's hand. Meanwhile, according to an embodiment, the external input TC may include a force and a touch.

The electronic device EA may sense the user's input TC provided on all surfaces of the window WW. Although it is shown in FIG. 1A for ease of illustration that the user's input TC is provided on the front surface of the electronic device EA, the user's input TC may be provided on the side surfaces of the electronic device EA, and the electronic device EA may easily sense the position and intensity information of the external input TC provided on the side surfaces. That is, according to an embodiment, each of the surfaces of the window WW may be configured to display images, and the window WW may include the front surface FS and one more side surfaces.

Additionally, the electronic device EA may be configured sense input on both the front surface, and one or more other surfaces of the electronic device EA, including the side surfaces of the window WW, as well as other surfaces where the window WW is not located.

The electronic device EA may include a window WW, an electronic panel EP, and a housing unit HU. The window WW protects the upper surface of the electronic panel EP. The window WW may be optically transparent. Accordingly, the image displayed on the electronic panel EP may be viewed by the user through the window WW. The window WW may be composed of glass, plastic, or film.

The window WW may include at least a part bent on a cross-section defined by the first direction D1 and the second direction D2. The window WW includes a front surface FS, a first side surface SS1, a second side surface S22, a third side surface SS3, and a fourth side surface SS4.

In FIGS. 1A and 1B, the front surface FS is shown as a plane perpendicular to the third direction D3. Each of the first side surface SS1, the second side surface S22, the third side surface SS3 and the fourth side surface SS4 is bent or curved from the front surface FS toward the rear of the electronic device EA. Each of the first side surface SS1 and the second side surface SS2 may be a surface that is bent from the front surface FS and perpendicular to the first direction D1. The first side surface SS1 and the second side surface S22 may be opposed to each other in the first direction D1.

Each of the third side surface SS3 and the fourth side surface SS4 may be a surface that is bent from the front surface FS and perpendicular to the second direction D2. The third side surface SS3 and the fourth side surface S24 may be opposed to each other in the second direction D2.

The electronic panel EP may include a main part P0 and a plurality of cut-out parts P1, P2, P3 and P4. The main part P0 may be arranged parallel to the front surface FS and may have a shape corresponding to the front surface FS. The main part P0 may include a main active area AA0 for displaying the image IM at the front surface FS.

The cut-out parts P1, P2, P3, and P4 may include first to fourth cut-out parts P1, P2, P3, and P4. The first to fourth cut-out parts P1, P2, P3 and P4 are located on the sides of the main part P0 and protrude from the main part P0.

Although it is shown in FIG. 1B for ease of illustration that the first to fourth cut-out parts P1, P2, P3 and P4 are parallel to the main part P0, the first to fourth cut-out parts P1, P2, P3 and P4 may be bent from the main part P0 and assembled so as to face the first to fourth side surfaces SS1, SS2, SS3 and SS4. The first to fourth cut-out parts P1, P2, P3 and P4 may include sub-active areas AA1, AA2, AA3, and AA4 to provide images IM1, IM2, IM3 and IM4 to the first to fourth side surfaces SS1, SS2, SS3 and SS4.

On the other hand, according to an embodiment, the electronic panel EP may be assembled in various forms according to the shape of the window WW. For example, only a part of the cut-out parts P1, P2, P3 and P4 may be bent and assembled from the main part P0, and the cut-out parts P1, P2, P3, and P4 may all be assembled into a shape defining the same plane as the main part P0. The electronic device EA according to an embodiment of the inventive concept may be assembled in various forms according to a set or predetermined design, and is not limited to any one embodiment.

For ease of explanation, the configurations of the electronic panel EP are separately shown in FIGS. 2A to 2C. As shown in FIGS. 2A to 2C, the electronic panel EP may include a display unit DU, a first sensor (or first input sensor) ISU1, and a second sensor (or second input sensor) ISU2.

As shown in FIG. 2A, the display unit DU may include a plurality of pixels PX. The pixels PX may be located in the active areas AA0, AA1, AA2, AA3, and AA4, respectively, and emit light. The pixels PX may be divided into a plurality of pixel groups PXG0, PXG1, PXG2, PXG3, and PXG4.

The main pixel group PXG0 among the pixel groups PXG0, PXG1, PXG2, PXG3, and PXG4 may be located in the main active area AA0. The image displayed by the main pixel group PXG0 may be viewed from the outside through the front surface FS.

The first sub-pixel group PXG1 of the pixel groups PXG0, PXG1, PXG2, PXG3, and PXG4 may be located in the first sub-active area AA1. The image displayed by the first sub-pixel group PXG1 may be viewed from the outside through the first side surface SS1.

The second sub-pixel group PXG2 of the pixel groups PXG0, PXG1, PXG2, PXG3, and PXG4 may be located in the second sub-active area AA2. The image displayed by the second sub-pixel group PXG2 may be viewed from the outside through the second side surface SS2.

The third sub-pixel group PXG3 of the pixel groups PXG0, PXG1, PXG2, PXG3, and PXG4 may be located in the third sub-active area AA3. The image displayed by the third sub-pixel group PXG3 may be viewed from the outside through the third side surface SS3.

The fourth sub-pixel group PXG4 of the pixel groups PXG0, PXG1, PXG2, PXG3, and PXG4 may be located in the fourth sub-active area AA4. The image displayed by the fourth sub-pixel group PXG4 may be viewed from the outside through the fourth side surface SS4.

The pixel groups PXG0, PXG1, PXG2, PXG3, and PXG4 may display images independent of each other or display images related to each other. For example, images displayed in each of the active areas AA0, AA1, AA2, AA3, AA4, and AA5 may display one image. Alternatively, an image including main information is displayed in the main active area AA0, and an icon that requires a user input or a button image for controlling an image displayed in the main active area AA0 may be displayed in the first to fourth sub-active areas AA1, AA2, AA3, and AA4. The pixel groups PXG0, PXG1, PXG2, PXG3, and PXG4 may be connected to one driving circuit and driven, and may be independently driven through separate driving circuits independent of each other, but are not limited to any one embodiment.

Referring to FIG. 2B, the first sensor ISU1 senses external inputs TC applied from the outside. For example, the first sensor ISU1 senses the input provided to the main active area AA0 through the front surface FS of the window WW.

The first sensor ISU1 includes a plurality of first sensing electrodes TE1, a plurality of second sensing electrodes TE2, a plurality of lines TL1, TL2 and TL3, and a plurality of sensing pads T1, T2, and T3.

The first sensing electrodes TE1 and the second sensing electrodes TE2 are arranged in the main active area AA0. The first sensor ISU1 may obtain information on the external input TC through a change in capacitance between the first sensing electrodes TE1 and the second sensing electrodes TE2.

The first sensing electrodes TE1 are arranged along the first direction DR1 and each of them extends along the second direction DR2. Each of the first sensing electrodes TE1 may include a first sensing pattern SP1 and a first connection pattern BP1.

According to an embodiment, the first sensing pattern SP1 may have a rhombic shape. However, this is illustrated by way of example, and the first sensing pattern SP1 may have various shapes and is not limited to any one embodiment.

The first connection pattern BP1 is connected to the first sensing pattern SP1. The first connection pattern BP1 may be located between the two first sensing patterns to connect the two first sensing patterns.

The second sensing electrodes TE2 are arranged along the second direction DR2 and each of them extends along the first direction DR1. Each of the second sensing electrodes TE2 may include a second sensing pattern SP2 and a second connection pattern BP2.

The second sensing pattern SP2 may be spaced from the first sensing pattern SP1. The first sensing pattern SP1 and the second sensing pattern SP2 may be electrically insulated. The first sensing pattern SP1 and the second sensing pattern SP2 are not in contact with each other and may transmit and receive independent electrical signals.

According to an embodiment, the second sensing pattern SP2 may have the same shape as the first sensing pattern SP1. For example, the second sensing pattern SP2 may have a rhombic shape. However, this is illustrated by way of example, and the second sensing pattern SP2 may have various shapes and is not limited to any one embodiment.

The second connection pattern BP2 is connected to the second sensing pattern SP2. The second connection pattern BP2 may be located between the two second sensing patterns to connect the two second sensing patterns.

According to an embodiment, each of the first sensing pattern SP1 and the second sensing pattern SP2 may include an optically transparent material. Thus, even if the first sensing pattern SP1 and the second sensing pattern SP2 overlap with the pixel PX, the image IM displayed by the display unit DU may be easily viewed by the user.

Alternatively, each of the first sensing patterns SP1 and the second sensing patterns SP2 may include a plurality of mesh lines. Each of the mesh lines defines opening parts overlapping the light emitting area of the pixel PX. Thus, it may be possible to prevent or reduce instances of the visibility of the image IM displayed by the display unit DU being deteriorated by the first sensor ISU1.

The sensing lines TL1, TL2, and TL3 are located in areas other than the main active area AA0. For example, the sensing lines TL1, TL2, and TL3 may connect the first and second sensing electrodes TE1 and TE2 and the sensing pads T1, T2, and T3 through at least any one of the first to fourth sub-areas AA1, AA2, AA3, and AA4. The sensing lines TL1, TL2 and TL3 may include first sensing lines TL1, second sensing lines TL2, and third sensing lines TL3.

The first sensing lines TL1 are connected to the first sensing electrodes TE1, respectively. According to an embodiment, the first sensing lines TL1 are connected to the left ends of the first sensing electrodes TE1, respectively. The first sensing lines TL1 may be connected to the first sensing pads AT1 through the first sub-active area AA1 and the third sub-active area AA3, respectively.

The second sensing lines TL2 are connected to upper ends of both ends of the second sensing electrodes TE2, respectively. The second sensing lines TL2 connect the second sensing electrodes TE2 and the second sensing pads T2, respectively. The second sensing lines TL2 sequentially may pass through the fourth sub-active area AA4, the second sub-active area AA2, and the third sub-active area AA3, and may be respectively connected to the second sensing pads AT2.

The third sensing lines TL3 are connected to the lower ends of both ends of the second sensing electrodes TE2, respectively. The third sensing lines TL3 connect the second sensing electrodes TE2 and the third sensing pads T3, respectively. The third sensing lines TL3 may be connected to the third sensing pads AT3, respectively, through the third sub-active area AA3.

According to an embodiment, the second sensing electrodes TE2 may be connected to the second sensing lines TL2 and the third sensing lines TL3, respectively. Accordingly, sensitivity to the area may be uniformly maintained with respect to the second sensing electrodes TE2 having a relatively longer length than the first sensing electrodes TE1. However, this is illustratively shown, in the first sensor ISU1 according to an embodiment of the inventive concept, the third sensing lines TL3 may be omitted and are not limited to any one embodiment.

According to an embodiment, the sensing lines TL1, TL2 and TL3 may be arranged to overlap with at least one of the first to fourth sub-active areas AA1, AA2, AA3, or AA4. As the sensing lines TL1, TL2 and TL3 are located in the first to fourth sub-active areas AA1, AA2, AA3 and AA4 having a relatively large area as compared with the peripheral area NAA, the integration of the sensing lines TL1, TL2, and TL3 in the first sensor ISU1 may be reduced. In addition, the occurrence of defects such as noise due to electrical interference between the sensing lines TL1, TL2 and TL3 may be alleviated, so that the electrical reliability of the electronic panel EP may be improved.

Referring to FIG. 2C, the second sensor ISU2 senses an external input TC applied from the outside. For example, the second sensor ISU2 may sense inputs provided to the first to fourth sub-active areas AA1, AA2, AA3, and AA4 through the first to fourth side surfaces SS1, SS2, SS3 and SS4 of the window WW.

The second sensor ISU2 may include a plurality of additional sensing electrodes ATE1, ATE2, ATE3, and ATE4. The additional sensing electrodes ATE1, ATE2, ATE3 and ATE4 may be divided into first to fourth additional sensing electrodes ATE1, ATE2, ATE3 and ATE4 according to the arranged area.

The first additional sensing electrode ATE1 is located in the first sub-active area AA1. The first additional sensing electrode ATE1 includes a plurality of first additional sensing patterns AS1 and a plurality of first additional sensing lines AL1. The first additional sensing lines AL1 connect the first additional sensing patterns AS1 and the first additional sensing pads AT1, respectively.

The second additional sensing electrode ATE2 is located in the second sub-active area AA2. The second additional sensing electrode ATE2 includes a plurality of second additional sensing patterns AS2 and a plurality of second additional sensing lines AL2. The second additional sensing lines AL2 connect the second additional sensing patterns AS2 and the second additional sensing pads AT2, respectively.

The third additional sensing electrode ATE3 is located in the third sub-active area AA3. The third additional sensing electrode ATE3 includes a plurality of third additional sensing patterns AS3 and a plurality of third additional sensing lines AL3. The third additional sensing lines AL3 connect the third additional sensing patterns AS3 and the third additional sensing pads AT3, respectively.

The fourth additional sensing electrode ATE4 is located in the fourth sub-active area AA4. The fourth additional sensing electrode ATE4 includes a plurality of fourth additional sensing patterns AS4 and a plurality of fourth additional sensing lines AL4. The fourth additional sensing lines AL4 connect the first additional sensing patterns AS4 and the fourth additional sensing pads AT4, respectively.

Thus, as described above, according to an embodiment, the electronic device EA may include a first sensor ISU1, having a plurality of first sensing electrodes TE1 and second sensing electrodes TE2, overlapping a front surface FS of the electronic device EA. Additionally, the electronic device EA may include a plurality of additional sensing electrodes (e.g., ATE1 through ATE4) located at various additional side surfaces of the electronic device EA, for sensing user input at side surfaces of the electronic device EA.

The first to fourth additional sensing electrodes ATE1, ATE2, ATE3 and ATE4 receive driving signals from the outside through the first to fourth additional sensing pads AT1, AT2, AT3 and AT4, respectively. In FIG. 2C, it is shown that the first to fourth additional sensing electrodes ATE1, ATE2, ATE3, ATE4 receive driving signals through one driving circuit.

However, this is illustrated by way of example, and according to an embodiment of the inventive concept, the first to fourth additional sensing pads AT1, AT2, AT3, and AT4 may be provided separately from each other. For example, the first to fourth additional sensing pads AT1, AT2, AT3, and AT4 may be provided adjacent to each of the first to fourth sub-active areas AA1, AA2, AA3, and AA4. At this time, the first to fourth additional sensing pads AT1, AT2, AT3, and AT4 may receive driving signals through independent driving circuits, and the first to fourth additional sensing electrodes ATE1, ATE2, ATE3, and ATE4 may be independently driven.

Also, the second sensor ISU2 may be driven in self-cap, or may be driven in mutual-cap, or may be driven in a mixed manner thereof. The second sensor ISU2 according to an embodiment of the inventive concept may be driven in various ways, and is not limited to any one embodiment.

According to an embodiment, the second sensor ISU2 may be located in an area overlapping with the first to third sensing lines TL1, TL2 and TL3 on a plane among the configurations of the first sensor ISU1. The first to third sensing lines TL1, TL2 and TL3 and the first to fourth additional sensing electrodes ATE1, ATE2, ATE3 and ATE4 are overlapped and located in the first to fourth sub-active areas AA1, AA2, AA3, and AA4, so that the dead space of the electronic panel EP may be reduced and the interval between the sensing lines TL1, TL2 and TL3 may be increased. Therefore, the electrical reliability of the electronic panel EP may be improved.

Figure 3:
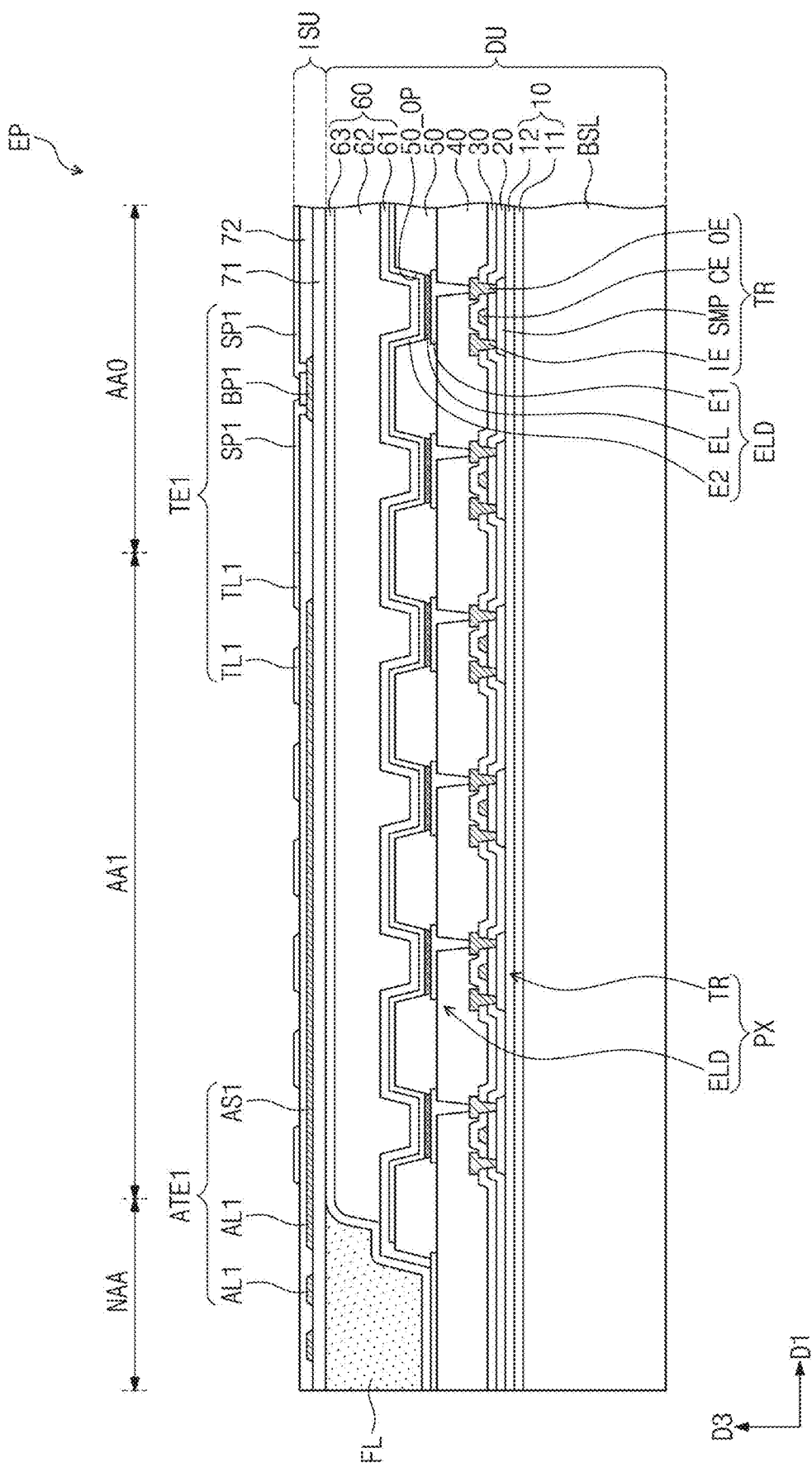
FIG. 3 is a cross-sectional view illustrating a part of an electronic panel according to an embodiment of the inventive concept.
Figure 4A:
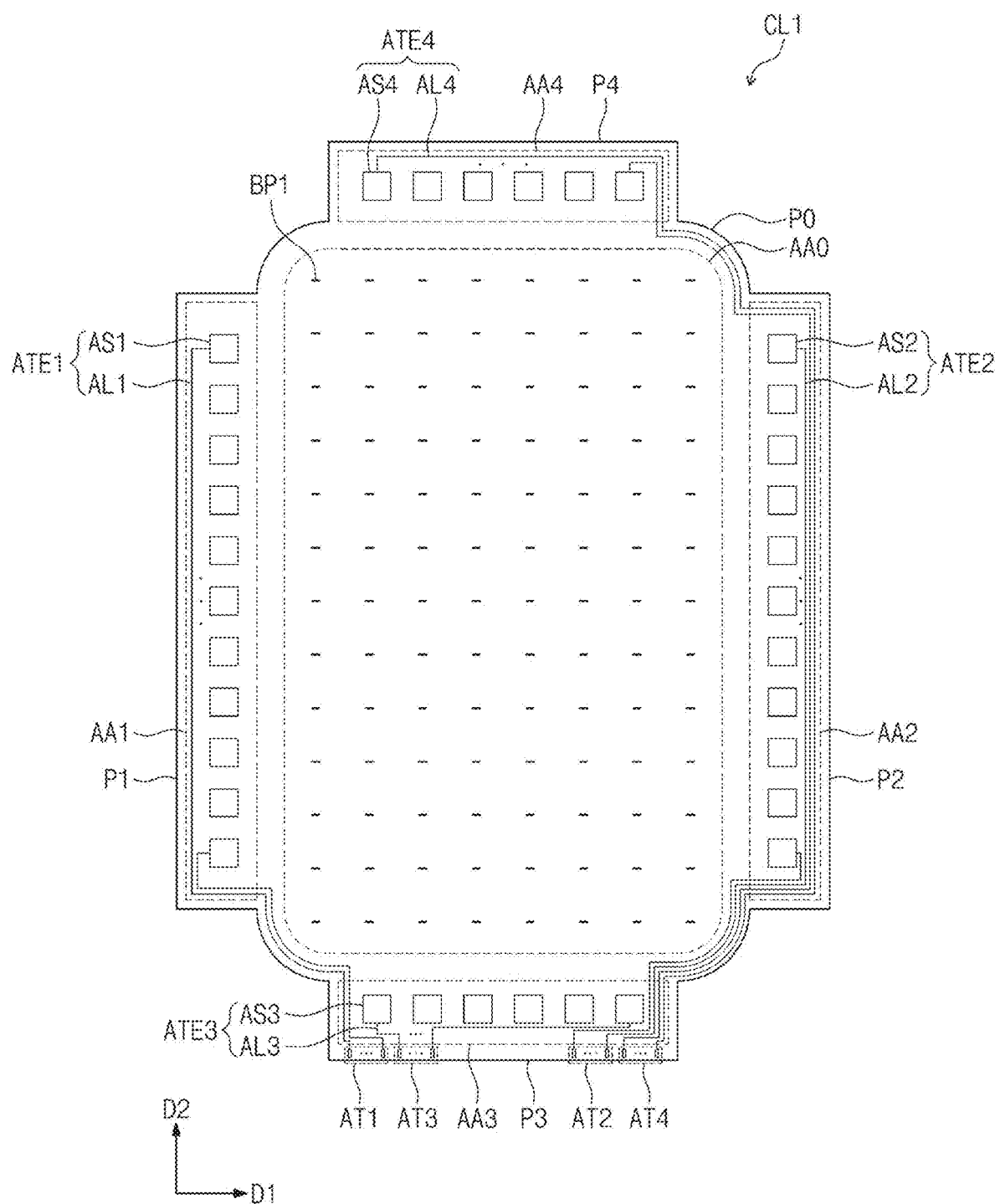
FIGS. 4A and 4B are plan views of some configurations of an electronic panel according to an embodiment of the inventive concept.
Figure 4B:
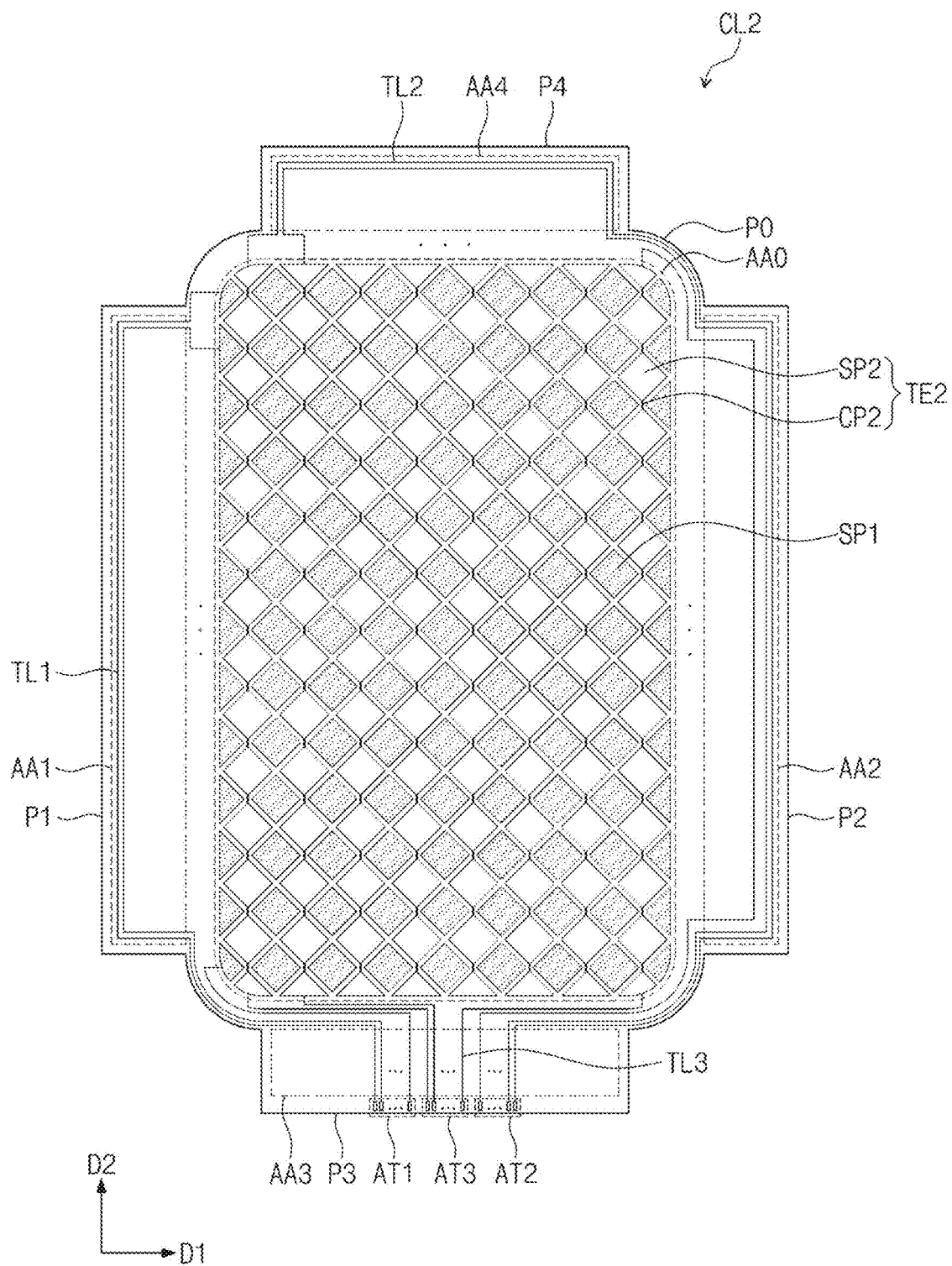

FIG. 3 is a cross-sectional view illustrating a part of an electronic panel according to an embodiment of the inventive concept. FIGS. 4A and 4B are plan views of some configurations of an electronic panel according to an embodiment of the inventive concept. FIG. 3 shows a part of the main active area AA0 and the first sub-active area AA1, and FIGS. 4A and 4B show the configurations located on different layers, respectively. Hereinafter, aspects of some example embodiments of the inventive concept will be described in more detail with reference to FIGS. 3 to 4B. Meanwhile, the same components as those described with reference to FIGS. 1A to 2C are given by the same reference numerals and some redundant description may be omitted for brevity.

As shown in FIG. 3, the electronic panel EP includes a display unit DU and a sensor ISU. The display unit DU corresponds to the display unit DU shown in FIG. 2A, and the sensor ISU may include a first sensor ISU1 shown in FIG. 2B and a second sensor ISU2 shown in FIG. 2C.

The display unit DU may include a base substrate BSL, a pixel PX, and a plurality of insulating layers 10, 20, 30, 40, 50, and 60. In FIG. 3, one transistor TR and one light emitting element ELD corresponding to a part of the configurations of the pixel PX are shown as an example for ease of explanation.

The base substrate BSL may include an insulating material. For example, the base substrate BSL may include a polyimide (PI). Accordingly, at least a part of the electronic panel EP, for example, the first sub-active area AA1, may be easily bent from the main active area AA0. However, this is an example embodiment, and the base substrate BSL may be provided in a rigid state. At this time, the first sub-active area AA1 may be fixed in a bent state. For example, the base substrate BSL may be formed of various materials such as glass and plastic, and is not limited to any one embodiment.

The first insulating layer 10 is located on the base substrate BSL. The first insulating layer 10 covers the front surface of the base substrate BSL. The first insulating layer 10 may include a barrier layer 11 and a buffer layer 12.

The barrier layer 11 may include an inorganic material. The barrier layer 11 may prevent oxygen or water flowing through the base substrate BSL from penetrating the pixel PX. The buffer layer 12 may include an inorganic material. The pixel PX has a higher adhesion force when located in the buffer layer 12 than when located directly on the barrier layer 11 or the base substrate BSL, and may be stably formed.

In 3, each of the barrier layer 11 and the buffer layer 12 is shown as a single layer for ease of explanation. However, this is illustratively shown, and the barrier layer 11 and the buffer layer 12 according to an embodiment of the inventive concept may be provided in plurality and may be stacked alternately with each other. Alternatively, at least one of the barrier layer 11 or the buffer layer 12 may be provided in plurality or may be omitted.

The transistor TR includes a semiconductor pattern SMP, a control electrode CE, an input electrode IE, and an output electrode OE. The semiconductor pattern SMP is located on the base substrate BSL. The semiconductor pattern SMP may include a semiconductor material. The control electrode CE is spaced apart from the semiconductor pattern SMP with the second insulating layer 20 therebetween.

The input electrode IE and the output electrode OE are spaced apart from the control electrode CE with the third insulating layer 30 therebetween. The input electrode IE and the output electrode OE of the transistor TR pass through the second insulating layer 20 and the third insulating layer 30 and are electrically connected to one side and the other side of the semiconductor pattern SMP, respectively.

On the other hand, this is illustratively shown, in the transistor TR according to an embodiment of the inventive concept, the input electrode IE and the output electrode OE may be located between the first insulating layer 10 and the second insulating layer 20 and directly connected to the semiconductor pattern SMP. Alternatively, a part of the semiconductor patterns SMP may function as the input electrode IE and the output electrode OE. The display unit DU according to an embodiment of the inventive concept may include transistors TR of various structures, and is not limited to any one embodiment.

The fourth insulating layer 40 is located on the second insulating layer 30 to cover the input electrode IE and the output electrode OE. The fourth insulating layer 40 may include an organic material and/or an inorganic material, and may have a single layer or a laminated structure.

The light emitting element ELD is located on the fourth insulating layer 40. The light emitting element ELD includes a first electrode E1, a light emitting layer EL, and a second electrode E2. The first electrode E1 may be connected to the transistor TR through the fourth insulating layer 40. Moreover, according to an embodiment, the electronic panel 200 may further include a separate connection electrode located between the first electrode E1 and the transistor TR, and at this time, the first electrode E1 may be electrically connected to the transistor TR through the connection electrode.

The fifth insulating layer 50 is located on the fourth insulating layer 40. An opening part 50_OP may be defined in the fifth insulating layer 50. The opening part 50_OP exposes at least a part of the first electrode E1. The fifth insulating layer 50 may include an organic material. In this embodiment, the fifth insulating layer 50 may be a pixel defining film.

The light emitting layer EL is located in the opening part 50_OP and located on the first electrode E1 exposed by the opening part 50_OP. The light emitting layer EL may include a light emitting material. For example, the light emitting layer EL may include at least one of materials emitting red, green, or blue light, and may include a fluorescent material or a phosphorescent material. The light emitting layer EL may include an organic light emitting material or an inorganic light emitting material. The light emitting layer EL may emit light in response to a potential difference between the first electrode E1 and the second electrode E2.

The second electrode E2 is located on the light emitting layer EL. The second electrode E2 may be opposed to the first electrode E1. In this embodiment, the second electrode E2 is shown with an integral shape overlapping the main active area AA0 and the first sub-active area AA1. The second electrode E2 may be provided commonly to a plurality of pixels. Each light emitting element ELD located in each of the pixels receives a common second power supply voltage through the second electrode E2. However, this is illustratively shown, and the second electrode E2 may be provided separately for each pixel or may be separately provided for each of the active areas AA0, AA1, AA2, AA3, and AA4, and is not limited to any one embodiment.

The second electrode E2 may include a transmissive conductive material or a semi-transparent conductive material. Accordingly, the light generated in the light emitting layer EL may be easily emitted toward the front surface FS (see FIG. 1A) through the second electrode E2. But, this is illustrated by way of example. Depending on the design, the light emitting element ELD according to an embodiment of the inventive concept may be driven in the rear surface light-emission system in which the first electrode E1 includes a transparent or semi-transparent material, or may be driven in a double-sided light-emission system in which light is emitted towards both front and rear surfaces, but is not limited to any one embodiment.

The sixth insulating layer 60 is located on the light emitting element ELD to seal the light emitting element ELD. In this embodiment, the sixth insulating layer 60 may be a sealing layer. In this embodiment, the second electrode E2 is shown with an integral shape overlapping the main active area AA0 and the first sub-active area AA1. The sixth insulating layer 60 may be provided commonly to a plurality of pixels. According to an embodiment, a capping layer covering the second electrode E2 may be further located between the second electrode E2 and the sixth insulating layer 60.

The sixth insulating layer 60 may include a first inorganic layer 61, an organic layer 62, and a second inorganic layer 63, which are sequentially stacked along the thickness direction of the electronic panel 200. In FIG. 3, each of the first inorganic layer 61, the organic layer 62, and the second inorganic layer 63 is shown as a single layer. However, this is illustratively shown, and at least one of the first inorganic layer 61, the organic layer 62, or the second inorganic layer 63 may be provided in plurality or may be omitted, but is not limited to any one embodiment.

The first inorganic layer 61 may cover the second electrode E2. The first inorganic layer 61 may prevent external moisture or oxygen from penetrating the light emitting element ELD. For example, the first inorganic layer 61 may include silicon nitride, silicon oxide, or a combination thereof. The first inorganic layer 61 may be formed through a deposition process.

The organic layer 62 may be located on the first inorganic layer 61 and contact the first inorganic layer 61. The organic layer 62 may provide a flat surface on the first inorganic layer 61. For example, the organic layer 62 may provide a flat surface to the active area AA1.

The curve formed on the upper surface of the first inorganic layer 61 and the particles existing on the first inorganic layer 61 are covered by the organic layer OL, such that this may prevent the influence of the surface state of the upper surface of the first inorganic layer 61 on the structures formed on the organic layer 62. Further, the organic layer 62 may relieve the stress between the contacting layers. The organic layer 62 may include an organic material, and may be formed through a solution process such as a spin coating process, a slit coating process, or an ink jet process.

The second inorganic layer 63 is located on the organic layer 62 to cover the organic layer 62. The second inorganic layer 63 may be stably formed on a relatively flat surface as compared to being located on the first inorganic layer 61. The second inorganic layer 63 seals moisture or the like emitted from the organic layer 62 to prevent it from being introduced into the outside. The second inorganic layer 63 may include silicon nitride, silicon oxide, or a combination thereof. The second inorganic layer 63 may be formed through a deposition process.

The sensor ISU may be located on the display unit DU. On the other hand, this is an example, and the sensor ISU may be located on the lower side of the display unit DU or may be embedded in the display unit DU, but embodiments according to the present disclosure are not limited to any one embodiment.

The sensor ISU may include a plurality of conductive layers CL1 and CL2 and a plurality of sense insulating layers 71 and 72. The conductive layers CL1 and CL2 include a first conductive layer CL1 and a second conductive layer CL2. The first conductive layer CL1 is located between the first sense insulating layer 71 and the second sense insulating layer 72. The second conductive layer CL2 is located on the second sense insulating layer 72.

FIG. 4A is a plan view of the first conductive layer CL1, and FIG. 4B is a plan view of the second conductive layer CL2. On the other hand, the main part P0 and the cut-out parts P1, P2, P3, and P4 constituting the shape of the electronic panel are substantially defined by the base substrate BSL, but FIGS. 4A and 4B show the main part P0 and the cut-out parts P1, P2, P3 and P4 by solid lines for ease of explanation.

The first conductive layer CL1 may include first to fourth additional sensing electrodes ATE1, ATE2, ATE3, and ATE4 and first connection patterns BP1. FIG. 3 shows a first additional sensing electrode ATE1 and a first connection pattern BP1 of the first conductive layer CL1 for ease of explanation.

The second conductive layer CL2 may include first sensing patterns SP1, second sensing patterns SP2, second connection patterns BP2, and first to third sensing lines TL1, TL2, and TL3. FIG. 3 shows the first sensing patterns SP1 and the first sensing lines TL1 in the second conductive layer CL2 for ease of explanation.

The first sensing lines TL1 may be formed of an optically transparent material. Accordingly, even if they overlap with the light emitting elements ELD located in the first sub-active area AA1 on a plane, it may be possible to prevent or reduce deterioration of the visibility of the image provided by the display unit DU. Alternatively, the first sensing lines TL1 may be arranged so as not to overlap with the light emitting element ELD on a plane. For example, the first sensing lines TL1 may be arranged to overlap with the fifth insulating layer 50 and not to overlap with the opening parts 50_OP of the fifth insulating layer 50. At this time, the influence of the first sensing lines TL1 on the light generated by the light emitting device ELD may be reduced.

According to an embodiment of the inventive concept, the first to fourth additional sensing electrodes ATE1, ATE2, ATE3, and ATE4 may be located on different layers from the first to third sensing lines TL1, TL2, and TL3. In relation to the first to fourth additional sensing electrodes ATE1, ATE2, ATE3, and ATE4, even if the first additional sensing electrode ATE1 and the first sensing lines TL1 are overlapped and located in the first sub-active area AA1 according to the first connection patterns BP1, instances of an electrical short between the two configurations may be prevented or reduced. According to an embodiment of the inventive concept, the sub-active areas AA1, AA2, AA3, and AA4 are utilized as areas where the first to fourth additional sensing electrodes ATE1, ATE2, ATE3 and ATE4 are located and the first to third sensing lines TL1, TL2, and TL3 are located at the same time, so that it is possible to prevent or reduce instances of an electrical short between the conductive patterns and alleviate the degree of integration of the conductive patterns in the same layer. Thus, an electronic panel EP having improved electrical reliability may be provided.

Figure 5A:
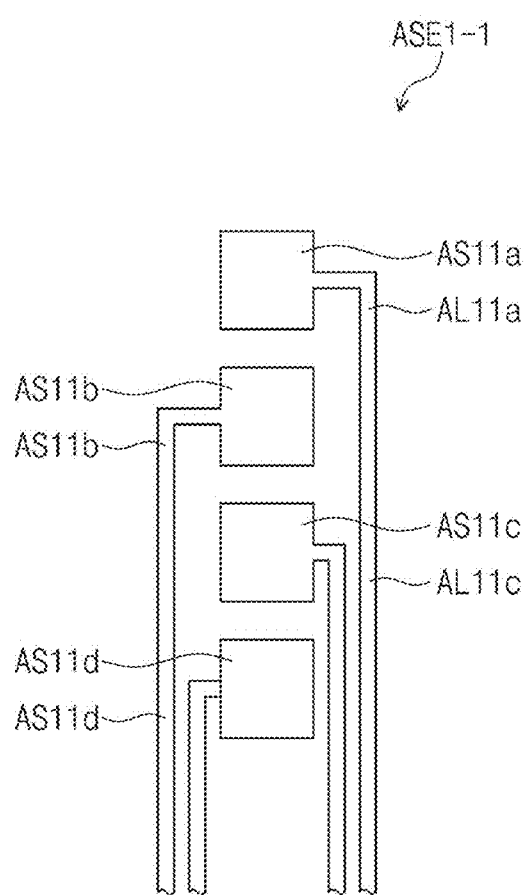
FIGS. 5A to 5C are plan views illustrating a part of a second sensor according to an embodiment of the inventive concept.
Figure 5B:
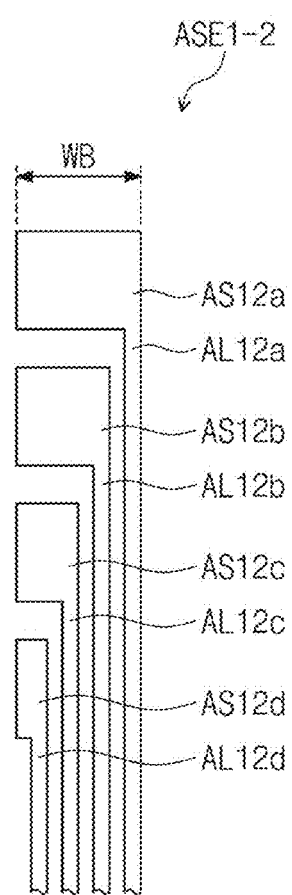
Figure 5C:
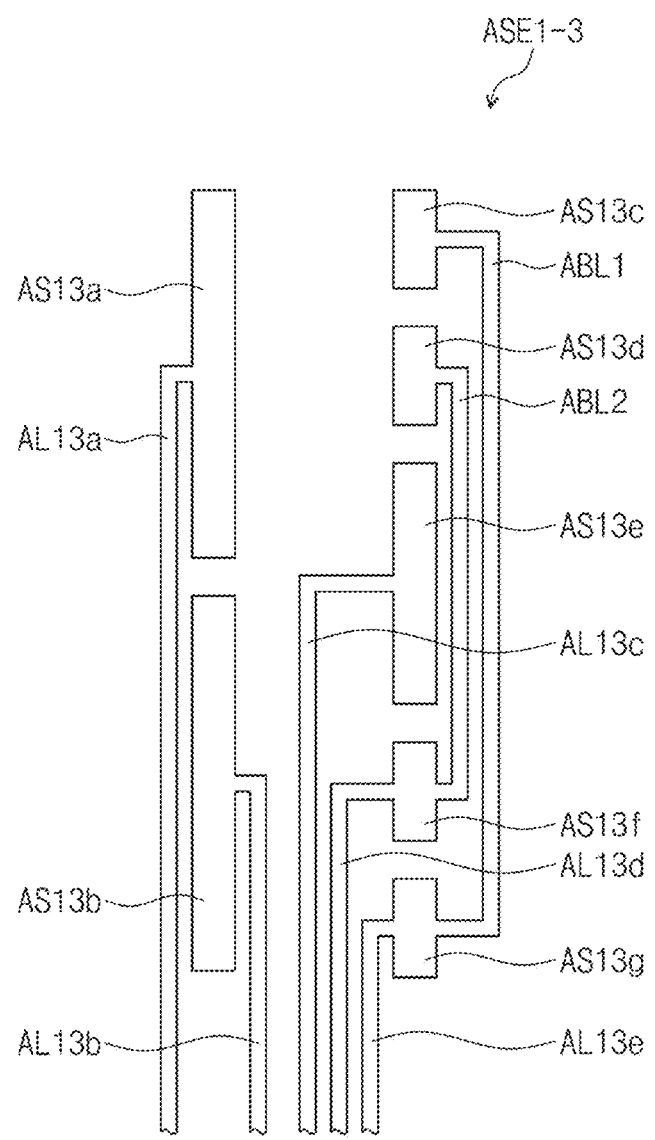

FIGS. 5A to 5C are plan views illustrating a part of a second sensor according to an embodiment of the inventive concept. FIGS. 5A to 5C show first additional sensing electrodes ATE1-1, ATE1-2 and ATE1-3, respectively.

Referring to FIG. 5A, the connection between the first additional sensing lines AS11a, AS11b, AS11c and AS11d of the first additional sensing electrode ATE1-1 and the first additional sensing lines AL11a, AL11b, AL11c, and AL11d may be made at alternate positions along one direction.

For example, among the first additional sensing patterns AS11a, AS11b, AS11c, and AS11d that are sequentially arranged along one direction, the first additional sensing patterns AS11a and AS11c located in the odd-numbered rows are connected to the corresponding first additional sensing lines AL11a and AL11c on the right sides, and among the first additional sensing patterns AS11a, AS11b, AS11c, and AS11d, the first additional sensing patterns AS11b and AS11d located in the even-numbered rows are connected to the corresponding first additional sensing lines AL11*b* and AL11*d* on the left sides. According to an embodiment of the inventive concept, the connection between the first additional sensing patterns AS11*a*, AS11*b*, AS11*c* and AS11*d* and the first additional sensing lines AL11*a*, AL11*b*, AL11*c* and AL11*d* may be in various forms and embodiments are not limited to any one embodiment.

Alternatively, referring to FIG. 5B, in the first additional sensing electrode ATE1-2, the areas (sizes) of the first additional sensing patterns AS12*a*, AS12*b*, AS12*c*, and AS12*d* may be different from each other. In FIG. 5B, the areas of the first additional sensing patterns AS12*a*, AS12*b*, AS12*c*, and AS12*d* are shown in a decreasing pattern along the direction in which they are located.

That is, according to an embodiment of the inventive concept, the width WB of the first additional sensing electrode ASE1-2 occupied by the first additional sensing patterns AS12*a*, AS12*b*, AS12*c* and AS12*d* and the first additional sensing lines AL12*a*, AL12*b*, AL12*c*, and AL12*d* respectively connected thereto may be kept constant along the arrangement direction of the first additional sensing patterns AS12*a*, AS12*b*, AS12*c*, and AS12*d*. According to an embodiment of the inventive concept, by designing the areas of the first additional sensing patterns AS12*a*, AS12*b*, AS12*c*, and AS12*d* variously, the area occupied by the first additional sensing electrode ASE1-2 may be easily controlled within a desired range.

FIG. 5C shows a first additional sensing electrode ATE1-3 that may be driven by a mutual capacitance type. The first additional sensing electrode ATE1-3 may include a plurality of first sub-sensing patterns AS13*a* and AS13*b*, a plurality of second sub-sensing patterns AS13*c*, AS13*d*, AS13*e* AS13*f*, and AS13*g*, a plurality of first additional sensing signal lines AL13*a*, AL13*b*, AL13*c*, AL13*d*, and AL13*e*, and a plurality of connection lines ABL1 and ABL2.

The first sub-sensing patterns AS13*a* and AS13*b* are respectively connected to corresponding first additional sensing signal lines AL13*a* and AL13*b* among the first additional sensing signal lines AL13*a*, AL13*b*, AL13*c*, AL13*d* and AL13*e*. The first sub-sensing patterns AS13*a* and AS13*b* receive electrical signals relative to the second sub-sensing patterns AS13*c*, AS13*d*, AS13*e* AS13*f* and AS13*g*. The first additional sensing electrodes ATE1-3 sense a capacitance change between the first sub-sensing patterns AS13*a* and AS13*b* and the second sub sensing patterns AS13*c*, AS13*d*, AS13*e* AS13*f* and AS13*g*, which face each other, to sense an external input.

The second sub-sensing patterns AS13*c*, AS13*d*, AS13*e* AS13*f* and AS13*g* may be connected to the corresponding first additional sensing signal lines AL13*c*, AL13*d*, and AL13*e* among the first additional sensing signal lines AL13*a*, AL13*b*, AL13*c*, AL13*d*, and AL13*e* or the connection lines ABL1 and ABL2.

The connection lines ABL1 and ABL2 connect the two separated second sub-sensing patterns among the second sub-sensing patterns AS13*c*, AS13*d*, AS13*e* AS13*f*, and AS13*g*. One of the connection lines ABL1 and ABL2 connects the second sub-sensing pattern AS13*c* located on the first row and the second sub-sensing pattern AS13*g* located on the fifth row among the second sub-sensing patterns AS13*c*, AS13*d*, AS13*e* AS13*f*, and AS13*g*. The other one of the connection lines ABL1 and ABL2 connects the second sub-sensing pattern AS13*d* located on the second row and the second sub-sensing pattern AS13*f* located on the fourth row among the second sub-sensing patterns AS13*c*, AS13*d*, AS13*e* AS13*f*, and AS13*g*. Accordingly, the second sub-sensing pattern AS13*c* located on the first row and the second sub-sensing pattern AS13*g* located on the fifth row receive the same electrical signal, and the second sub-sensing pattern AS13*d* located on the second row and the second sub-sensing pattern AS13*f* located on the fourth row receive the same electrical signal.

Among the second sub-sensing patterns AS13*c*, AS13*d*, AS13*e* AS13*f*, and AS13*g*, the second sub-sensing patterns AS13*e*, AS13*f*, and AS13*g* located on the third, fourth and fifth rows may be connected to corresponding first additional sensing signal lines AL13*c*, AL13*d*, and AL13*e*, respectively, among the first additional sensing signal lines AL13*a*, AL13*b*, AL13*c*, AL13*d*, and AL13*e*.

According to the inventive concept, electrical signals may be provided to the five second sub-sensing patterns AS13*c*, AS13*d*, AS13*e*, AS13*f*, and AS13*g* through only three first additional sensing signal lines AL13*c*, AL13*d*, and AL13*e*. According to the inventive concept, because the first additional sensing electrodes ASE1-3 may be driven using the number of sensing wirings or pads, which is less than the number of sensing patterns AS13*a*, AS13*b*, AS13*c*, AS13*d*, AS13*e*, AS13*f*, and AS13*g*, the design may be simplified while improving sensitivity to external inputs.

Figure 6A:
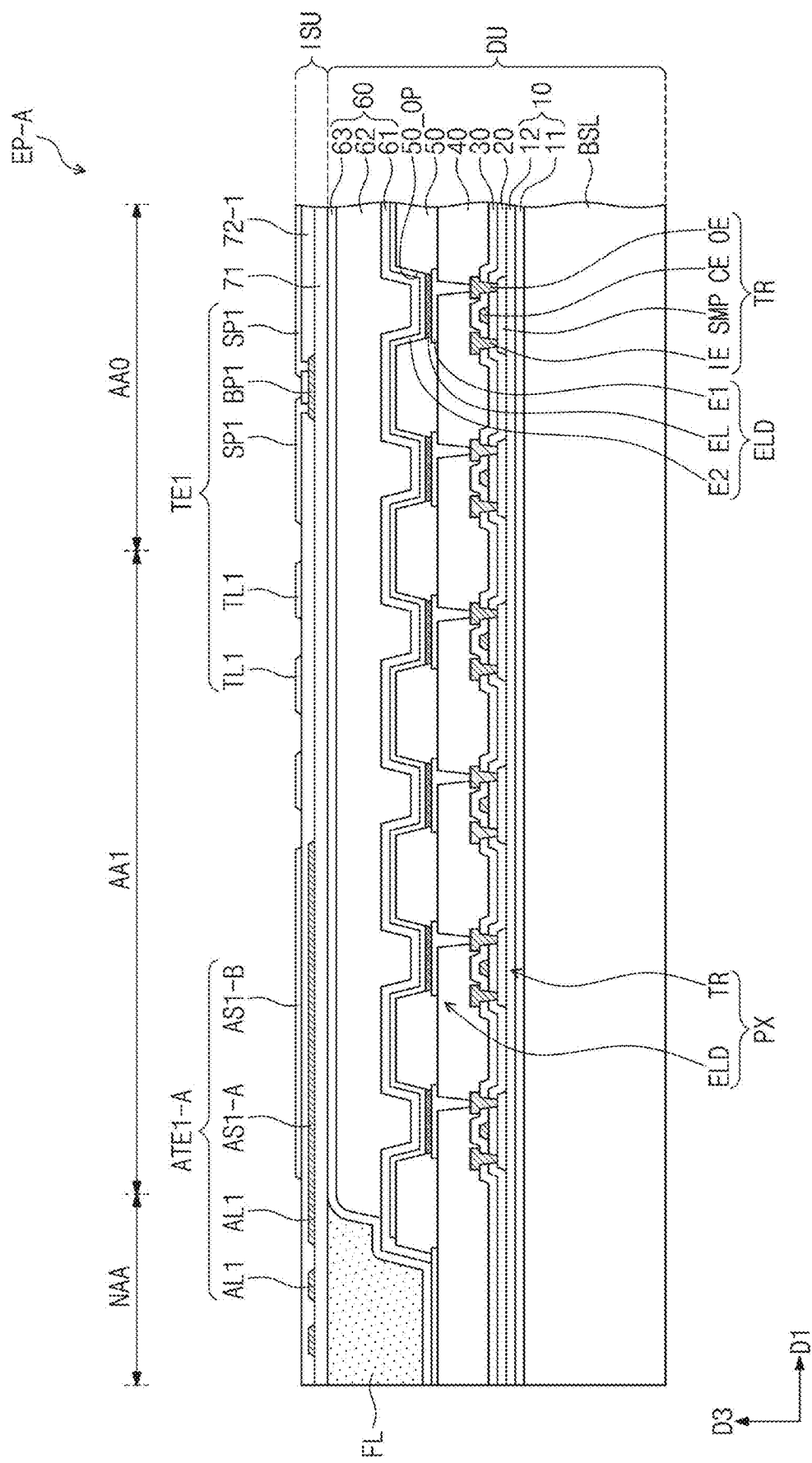
FIGS. 6A and 6B are cross-sectional views of electronic panels according to an embodiment of the inventive concept.
Figure 6B:
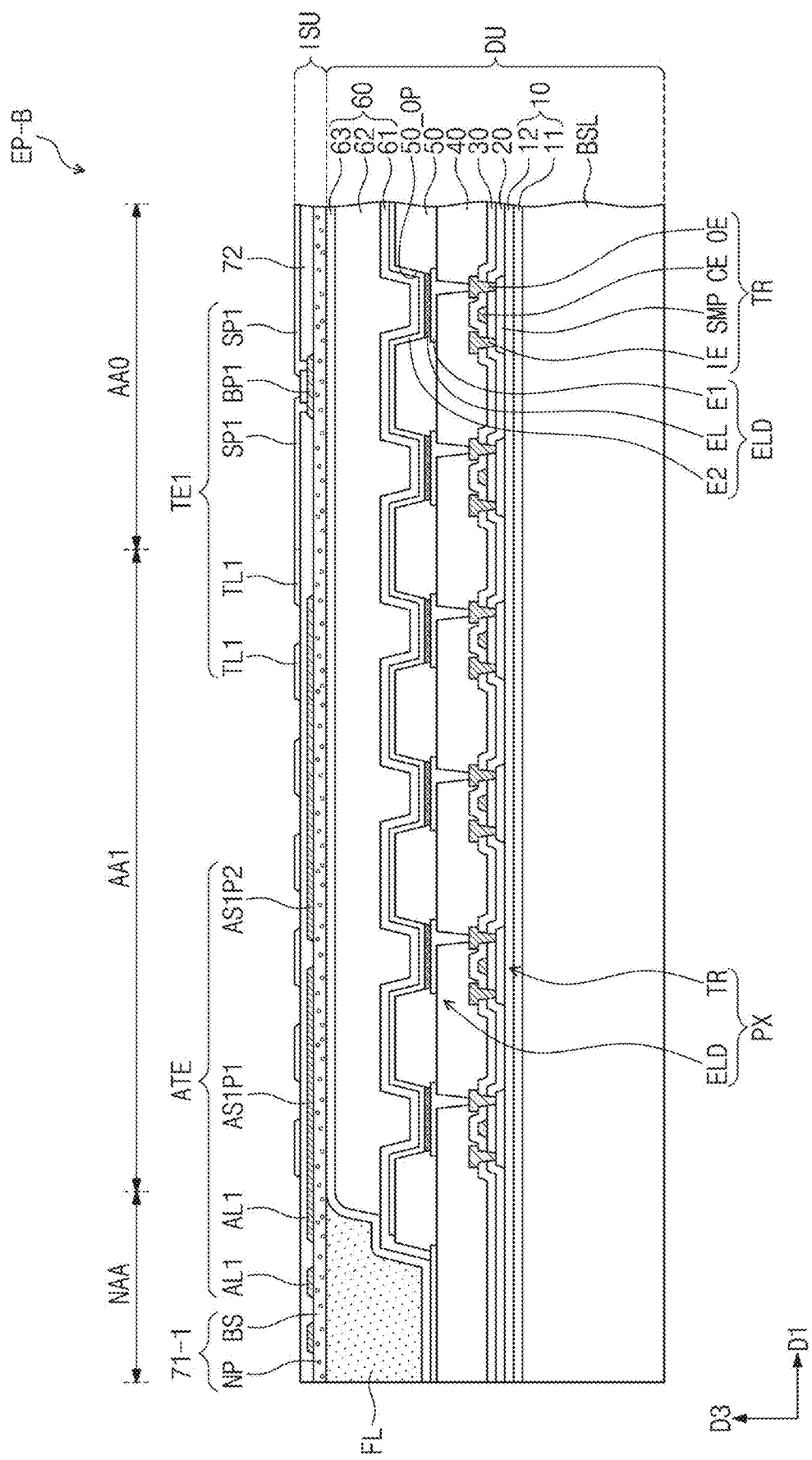

FIGS. 6A and 6B are cross-sectional views of electronic panels according to an embodiment of the inventive concept. FIGS. 6A and 6B show cross-sectional views of the electronic panels EP-A and EP-B in the area corresponding to FIG. 3 for ease of explanation. Hereinafter, further details according to an embodiment of the inventive concept will be described with reference to FIGS. 6A and 6B.

As shown in FIG. 6A, the first additional sensing electrode ATE1-A may include a first pattern AS1-A and a second pattern AS1-B located on different layers. The first pattern AS1-A is located between the first sense insulating layer 71 and the second sense insulating layer 72. The first pattern AS1-A may be located on the same layer as the first connection pattern BP1 located in the main active area AA0.

The second pattern AS1-B is located on the second sense insulating layer 72. The second pattern AS1-B may be located on the same layer as the first sensing patterns SP1 located in the main active area AA0. The second pattern AS1-B is located spaced part from the first sensing lines TL1 on a plane.

The second pattern AS1-B may overlap the first pattern AS1-A on a plane. The second sense insulating layer 72 may include a piezoelectric material. For example, the second sense insulating layer 72 may include lead zirconate titanate (PZT) or barium titanium oxide (BaTiO3 or Ba2TiO3).

When the thickness or shape of the second sense insulating layer 72 is modified by an external input applied to the first sub-active area AA1, an electrical signal may be applied to the first additional sensing electrode ATE1-A while the second sense insulating layer 72 is activated. The electronic panel EP-A according to an embodiment of the inventive concept senses an electrical signal applied to the first pattern AS1-A and the second pattern AS1-B so that it is possible to sense the intensity of the external input applied to the first sub-active area AA1.

Alternatively, as shown in FIG. 6B, in the electronic panel EP-B according to an embodiment of the inventive concept, the first sense insulating layer 71 may include a plurality of nanoparticles NP and a base member BP. The base member BP may be formed of a flexible insulating material, for example, may include an elastomeric binder resin. Each of the nanoparticles NP may have conductivity.

According to an embodiment, the first sense insulating layer 71 may have a quantum tunneling composite (QTC). The first additional sensing electrode ATE1-B may include a first pattern ASP1 and a second pattern ASP2 located on the same layer. The first pattern ASP1 and the second pattern ASP2 are spaced apart from each other on a plane and may receive different electrical signals.

When the thickness or shape of the first sense insulating layer 71-B is modified by an external input applied to the first sub-active area AA1, the distance between the nanoparticles NP may be changed so that the resistance of the first sense insulating layer 71 may be changed. The first additional sensing electrode ATE1-B senses the resistance change of the first sense insulating layer 71 so that it may easily sense the intensity of the external input applied to the first sub-active area AA1.

Figure 7A:
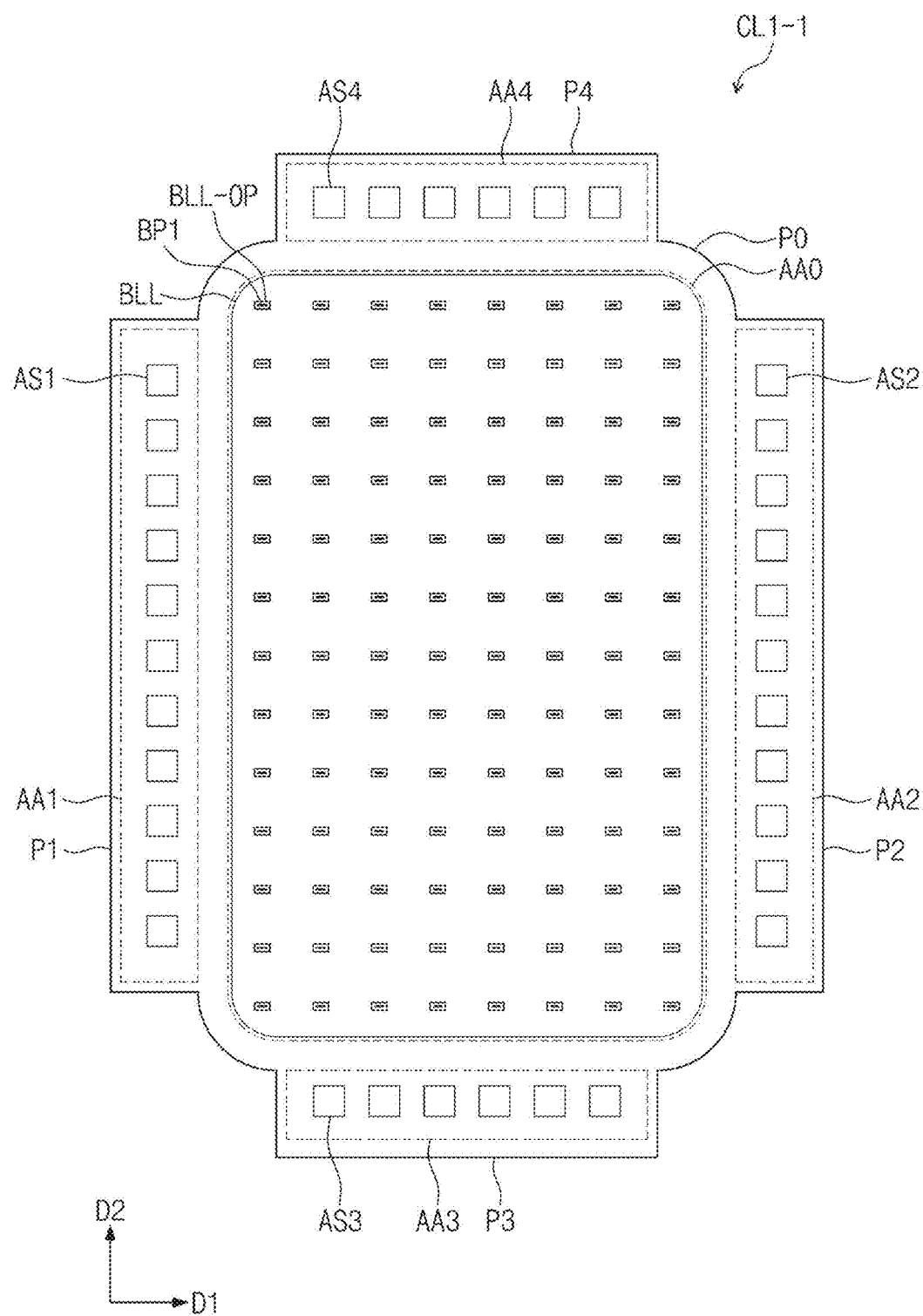
FIG. 7A is a cross-sectional view of an electronic panel according to an embodiment of the inventive concept.
Figure 7B:
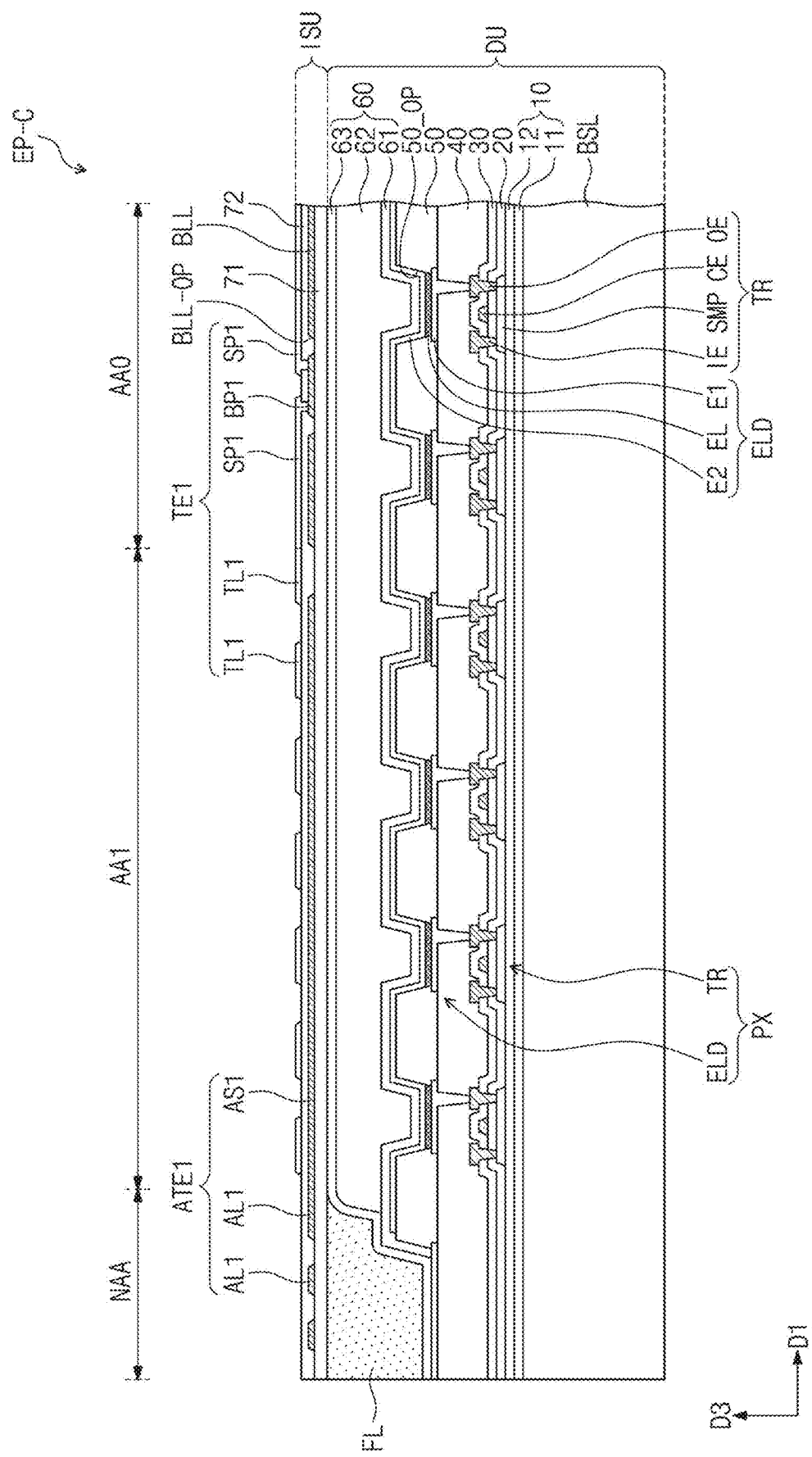
FIG. 7B is a plan view of a partial configuration of an electronic panel shown in FIG. 7A.

FIG. 7A is a cross-sectional view of an electronic panel according to an embodiment of the inventive concept. FIG. 7B is a plan view of a partial configuration of an electronic panel shown in FIG. 7A. FIG. 7A shows an area corresponding to FIG. 3, and FIG. 7B shows a first conductive layer CL1-1 corresponding to FIG. 4A. Hereinafter, further details according to an embodiment of the inventive concept will be described with reference to FIGS. 7A and 7B. Moreover, the same components as those described in FIGS. 1A to 6B are given by the same reference numerals and redundant description will be omitted.

As shown in FIGS. 7A and 7B, the electronic panel EP-2 may further include a shield layer BLL. The shield layer BLL may be located on the same layer as the first connection patterns BP1 and the second sensor ISU2. In FIGS. 7A and 7B, for ease of explanation, only the first to fourth additional sensing patterns AS1, AS2, AS3 and AS4 among the second sensor ISU2 are shown.

The shield layer BLL is located on the same layer as the first to fourth additional sensing patterns AS1, AS2, AS3 and AS4. The shield layer BLL is located in the main active area AA0 away from the first to fourth additional sensing patterns AS1, AS2, AS3 and AS4. Therefore, instances of an electrical short circuit between the shield layer BLL and the first to fourth additional sensing patterns AS1, AS2, AS3, and AS4 may be prevented or reduced.

On the other hand, the shield layer BLL is located on the same layer as the first connection patterns BP1. The set or predetermined opening parts BLL-OP may be defined in the shield layer BLL. The first connection patterns BP1 may be respectively located in the opening parts BLL-OP. Therefore, even if the shield layer BLL and the first connection patterns BP1 are located in the same main active area AA0, as they are arranged so as not to overlap on a plane, instances of the electrical short circuit between the shield layer BLL and the first connection patterns BP1 may be prevented or reduced.

The shield layer BLL may block electrical interference between the display unit DU and the sensor ISU. An electrical signal applied to the display unit DU, for example, an electrical signal applied to the second electrode E2 of the light emitting element ELD, may block the effect on the electrical signal applied to the sensor ISU. Accordingly, the external input sensitivity of the sensor ISU may be lowered, or instances of lowered electrical reliability such as noise occurrence may be prevented or reduced.

Figure 8A:
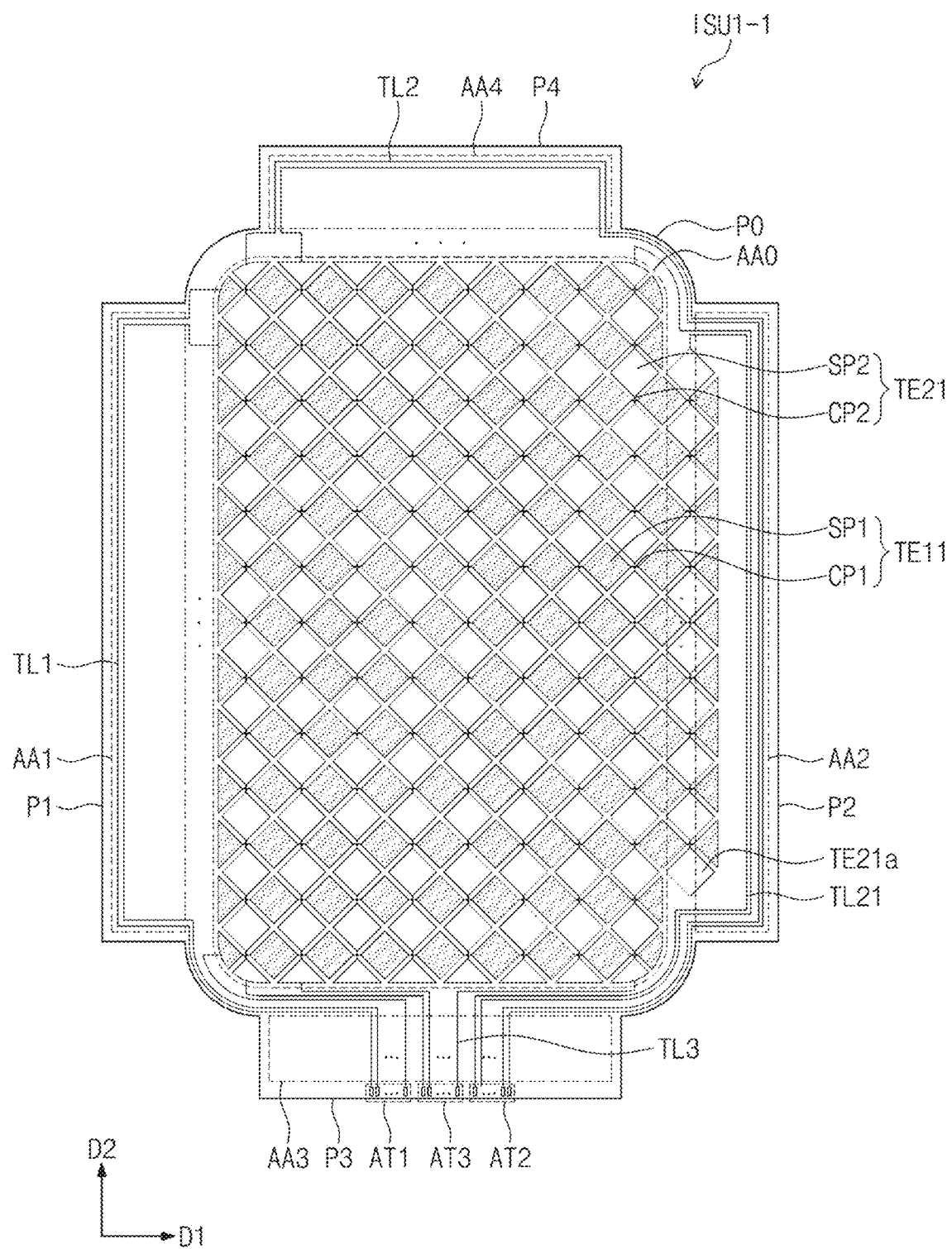
FIGS. 8A and 8B are plan views showing a part of a sensor according to an embodiment of the inventive concept.
Figure 8B:
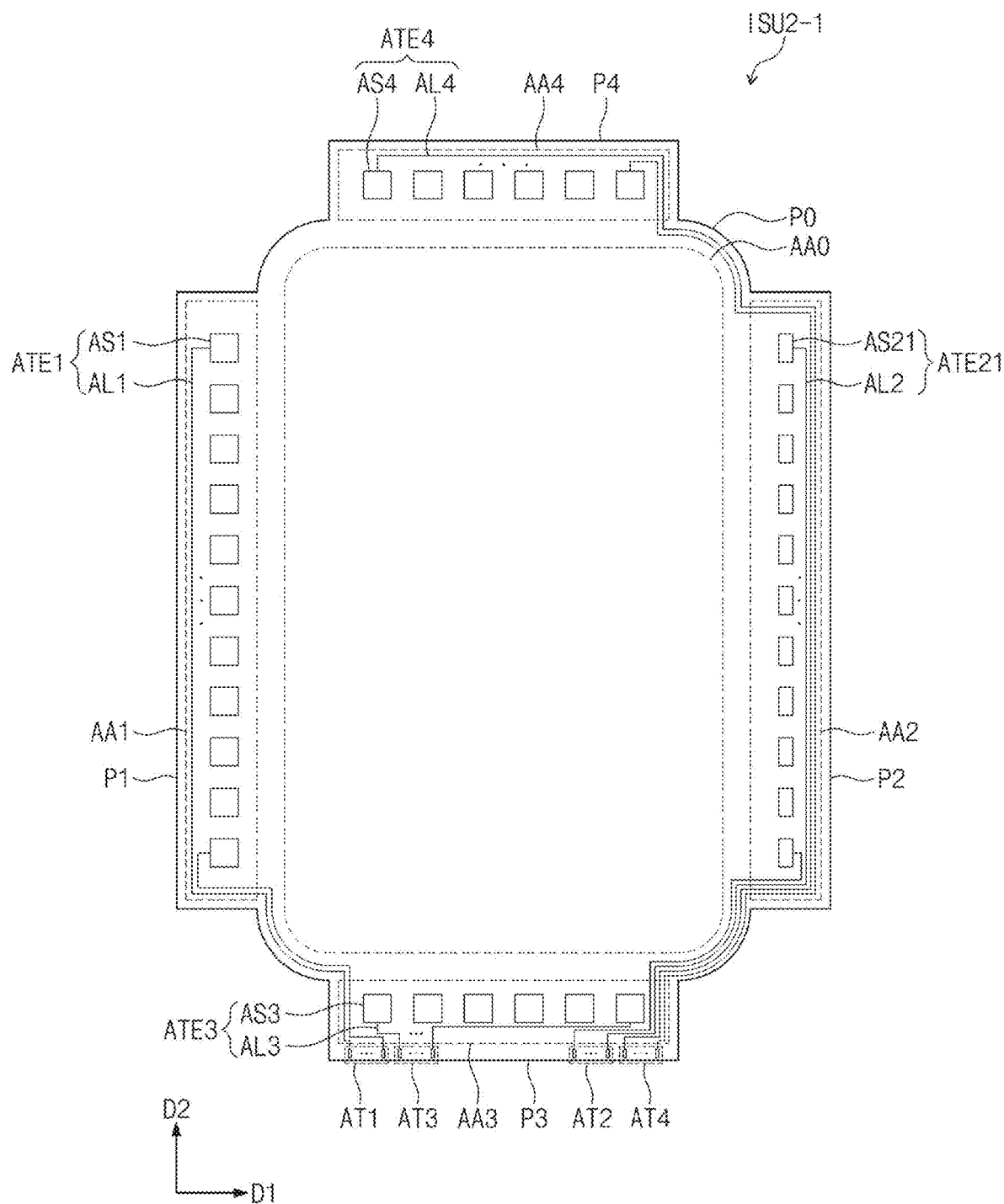

FIGS. 8A and 8B are plan views showing a part of an sensor according to an embodiment of the inventive concept. FIG. 8A shows a plan view of a first sensor ISU1-1, and FIG. 8B shows a second sensor ISU2-1. Hereinafter, further details of some example embodiments of the inventive concept will be described with reference to FIGS. 8A and 8B.

Referring to FIG. 8A, the first sensor ISU1-1 may be extended to cover at least a part of the second sub-active area AA2 from the main active area AA0. A part TE21a of the second sensing electrodes TE21 and a part of the first sensing electrodes TE11 overlap the second sub-active area AA2. In FIG. 8A, a part TE21a of the second sensing electrodes TE21 may be one electrode constituting one column, and a part of the first sensing electrodes TE11 may be the ends of some electrodes of the first sensing electrodes TE11.

Referring to FIG. 8B, the second sensor ISU2-1 may include a second additional sensing electrode ATE21 that occupies a part of the second sub-active area AA2. The second additional sensing electrode ATE21 may include second additional sensing patterns AS21 having relatively small areas compared to the second additional sensing electrode ATE2 (see FIG. 2B) shown in FIG. 2b to be located in an area other than the area occupied by the first sensor ISU1-1 of the second sub-active area AA2.

On the other hand, according to an embodiment, the second additional sensing patterns AS21 may be provided in different sizes from the first additional sensing pattern AS1 and the third and fourth additional sensing patterns AS3 and AS4. Accordingly, the first sub-sensing area AA1 and the third and fourth sub-sensing areas AA3 and AA4, which are not occupied by the sensing electrodes TE11 and TE21 of the first sensor ISU-1, are activated by the second sensor ISU2-1, and the second sub-sensing area AA2 may be activated by the first sensor ISU1-1 and the second sensor ISU2-1. However, this is illustratively shown, and in the second sensor ISU2-1 according to an embodiment of the inventive concept, the first to fourth additional patterns AS1, AS21, AS3, and AS4 may be provided with the same size as each other and are not limited to any one embodiment.

Figure 9A:
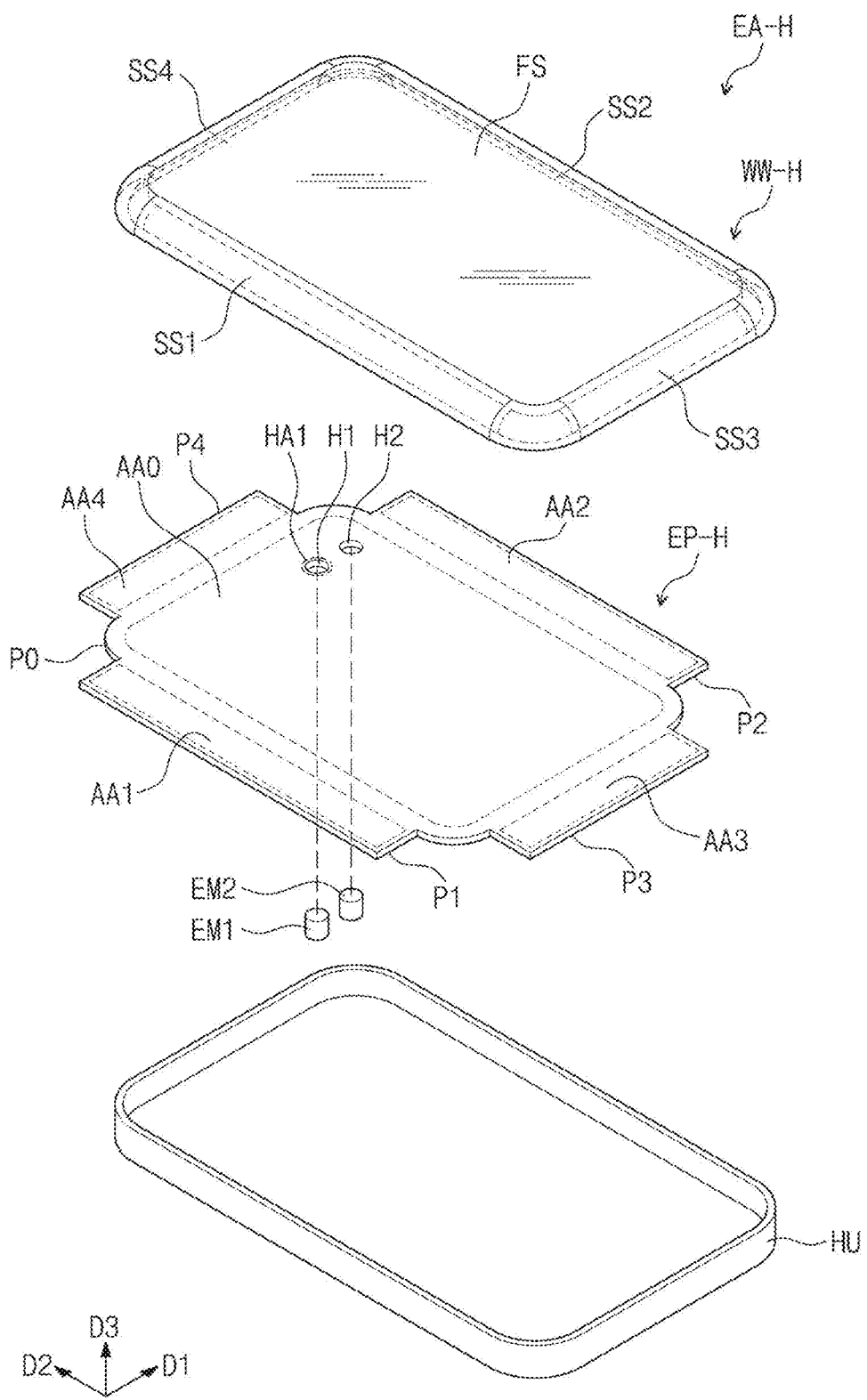
FIG. 9A is an exploded perspective view of an electronic device according to an embodiment of the inventive concept.
Figure 9B:
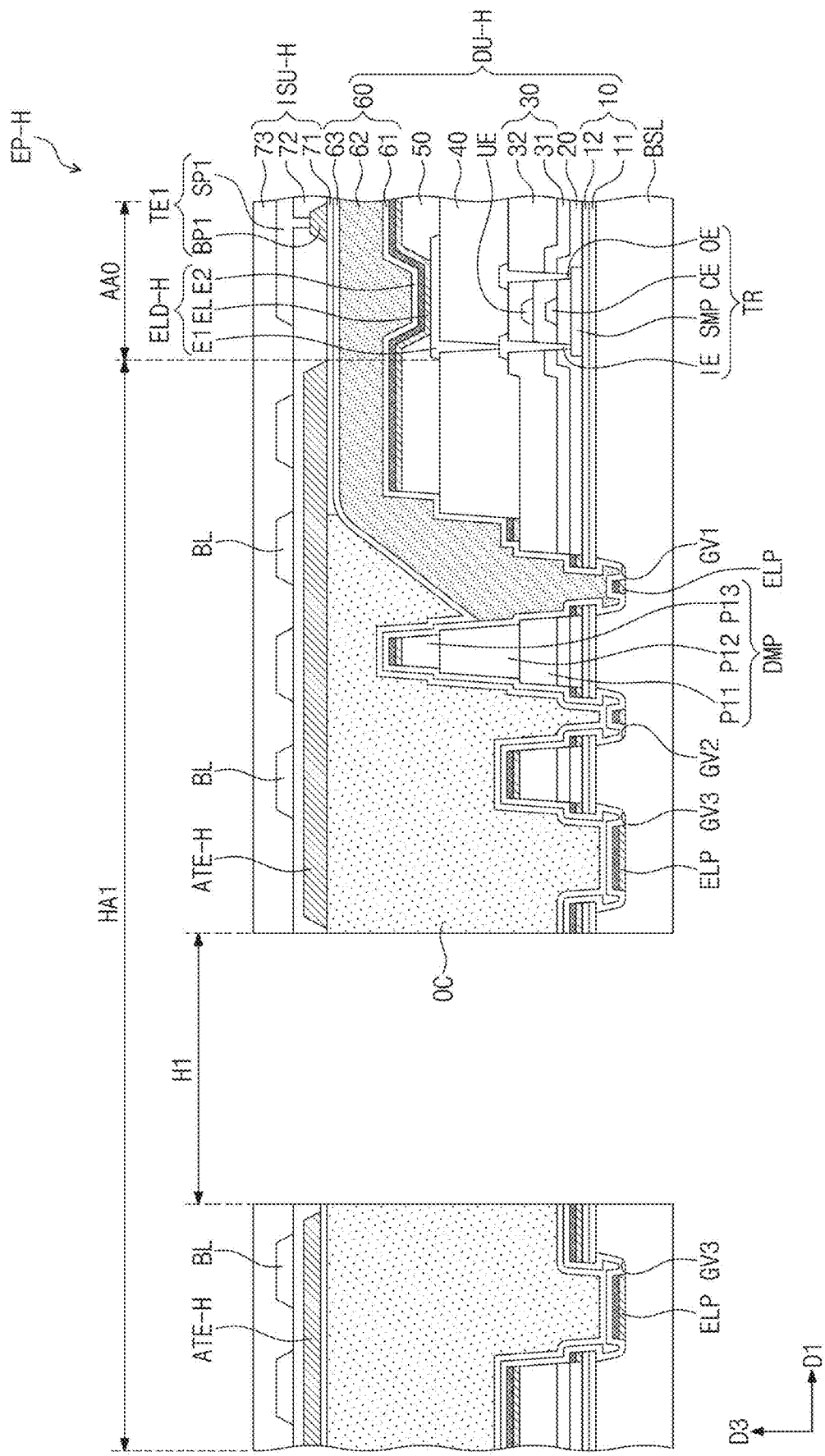
FIG. 9B is a cross-sectional view of a part of an area of the electronic device shown in FIG. 9A.

FIG. 9A is an exploded perspective view of an electronic device according to an embodiment of the inventive concept. FIG. 9B is a cross-sectional view of a part of an area of the electronic device shown in FIG. 9A. Further details of some example embodiments of the inventive concept will be described with reference to FIGS. 9A and 9B.

As shown in FIG. 9A, the electronic device EA-H includes a window WW-H, an electronic panel EP-H, electronic modules EM1 and EM2, and a housing unit HS-H. Because the window WW-H and the housing unit HS-H may correspond to the window WW and the housing unit HS shown in FIG. 1B, respectively, a duplicated description will be omitted.

Holes H1 and H2 may be defined in the electronic panel EP-H. The holes H1 and H2 may be defined through the electronic panel EP-H. Although it is shown that the holes H1 and H2 penetrate the main part P0 and are formed in the main active area AA0, this is illustrated by way of example, and the holes H1 and H2 may be formed in one of the first to fourth sub-active areas AA1, AA2, AA3, and AA4, but are not limited thereto.

According to an embodiment, the holes H1 and H2 may include a first hole H1 and a second hole H2 provided in plurality and spaced apart from each other. The electronic modules EM1 and EM2 may include a first electronic module EM1 arranged to correspond to the first hole H1 and a second electronic module EM2 arranged to correspond to the second hole H2.

The first and second electronic modules EM1 and EM2 include various functional modules for operating the electronic device EA-H. The first and second electronic modules EM1 and EM2 may be directly mounted on a motherboard electrically connected to the electronic panel EP-H or may be mounted on a separate board and electrically connected to the motherboard through a connector or the like. Each of the first and second electronic modules EM1 and EM2 may receive light or heat and emit it to the outside. For example, each of the first and second electronic modules EM1 and EM2 may include at least one of a camera, a speaker, a photo-sensing sensor, a thermal sensor, or a projector.

The first and second electronic modules EM1 and EM2 may receive external inputs respectively transmitted through the first and second holes H1 and H2 or provide outputs respectively through the first and second holes H1 and H2. Some or all of each of the first and second electronic modules EM1 and EM2 may be accommodated in each of the first and second holes H1 and H2. According to the inventive concept, as the first and second electronic modules EM1 and EM2 are arranged to overlap the main active area AA0, it may be possible to reduce a size of the bezel area in the electronic device EA-H.

Referring to FIG. 9B, the electronic panel EP-H may include a display unit DU-H and a sensor ISU-H. The display unit DU-H may include a configuration partially different from the display unit DU shown in FIG. 3.

For example, the third insulating layer 30 may have a multi-layer structure including two layers 31 and 32 sequentially stacked. The input electrode IE and the output electrode OE of the transistor TR may be connected to the semiconductor pattern SMP through the second insulating layer 20 and the two layers 31 and 32.

The display unit DU-H may further include an upper electrode UE. The upper electrode UE is located between the two layers 31 and 32 of the third insulating layer 30 and may overlap the control electrode CE on a plane. The upper electrode UE may receive the same electrical signal as the control electrode CE or receive a different electrical signal from the control electrode CE to serve as one electrode of the capacitor. On the other hand, this is illustratively shown, and in the electronic panel 200 according to an embodiment of the inventive concept, the upper electrode UE may be omitted and is not limited to any one embodiment.

In the light emitting element ELD-H, the organic layer OL may include a light emitting layer and a charge control layer. The light emitting layer may correspond to the light emitting layer EL of FIG. 3 described above. The charge control layer controls the movement of the charge to improve the luminous efficiency and lifetime of the light emitting element EE. At this time, the organic layer EL may include at least one of a hole transporting material, a hole injecting material, an electron transporting material, or an electron injecting material.

The electronic panel EP-H may further include a plurality of groove parts GV1, GV2, and GV3 and a dam part CMP. The groove parts GV1, GV2, and GV3 and the dam part CMP may be located in the hole area HA.

The groove parts GV1, GV2, and GV3 may be portions formed as a part of the base substrate BSL is recessed. The groove parts GV1, GV2, and GV3 may be defined spaced apart from each other. The groove parts GV1, GV2 and GV3 may include first to third groove parts GV1, GV2 and GV3 arranged sequentially along the direction approaching the first hole H1.

Each of the first to third groove parts GV1, GV2 and GV3 has a closed line shape surrounding the first hole MH1 or has an intermittent line shape surrounding at least a part of the edge of the first hole MH1 and is not limited to any one embodiment.

A deposition pattern ELP may be located in each of the first to third groove parts GV1, GV2 and GV3. The deposition pattern ELP may include the same material as at least one of the organic layer EL or the second electrode E2 and may be formed when forming the organic layer EL or the second electrode E2.

The electronic panel EP-H further includes groove parts GV1, GV2, and GV3 to block the continuity between the deposition pattern ELP and the light emitting element ELD. Thus, it may be possible to prevent or reduce damage to elements located in the main active area AA0 by cutting off the infiltration path of external contaminants, such as moisture or oxygen.

Also, the deposition pattern ELP located in each of the groove parts GV1, GV2 and GV3 is covered by the first inorganic layer 61 and the second inorganic layer 63, so that it may be possible to prevent the deposition pattern ELP from being transferred to other devices and affecting them during the manufacturing process of the electronic panel 200 Thus, the process reliability of the electronic panel EP-H may be improved. On the other hand, this is illustratively shown, and in the electronic panel EP-H according to an embodiment of the inventive concept, the groove parts GV1, GV2, and GV3 may be provided singly or omitted, and are not limited to any one embodiment.

The dam part DMP is located in the hole area HA to divide the formation area of the organic layer 62 into a set or predetermined area and may prevent further expansion. The dam part DMP may be provided in plurality and may be located between the groove parts GV1, GV2, and GV3. The dam part DMP is shown as a laminated structure including the first to third layers P11, P12, and P13. However, this is illustratively shown, and the dam part DMP may have a single-layer structure and is not limited to any one embodiment.

The planarization layer OC may be located in the hole area HA. The planarization layer OC covers the second inorganic layer 63 and covers the dam part DMP or the groove parts GV2 and GV3 forming the curvature in the hole area HA to provide a flat surface on the upper part.

The sensor ISU-H may further include a hole addition sensing electrode ATE-H and a connection line BL located in the hole area HA. The connection line BL is connected to the first sensing patterns SP1 located in the main active area AA0. The connection line BL connects between the first sensing patterns SP1 spaced with the hole H1 therebetween. Accordingly, even for the sensing patterns SP1 spaced with the hole H1 therebetween, an electrical signal may be stably provided without disconnection of the signal line.

The hole addition sensing electrodes ATE-H may be located on the planarization layer OC. The hole addition sensing electrode ATE-H may overlap the connection line BL on a plane. The hole addition sensing electrode ATE-H may sense an external input applied to the hole area HA.

The planarization layer OC includes an organic material. For example, the planarization layer OC may include the same material as the organic layer 62. Alternatively, the planarization layer OC may further include a plurality of conductive nanoparticles. At this time, the hole addition sensing electrode ATE-H may easily sense the intensity of the external input through the modification of the planarization layer OC by the external input applied to the hole area HA.

Figure 10A:
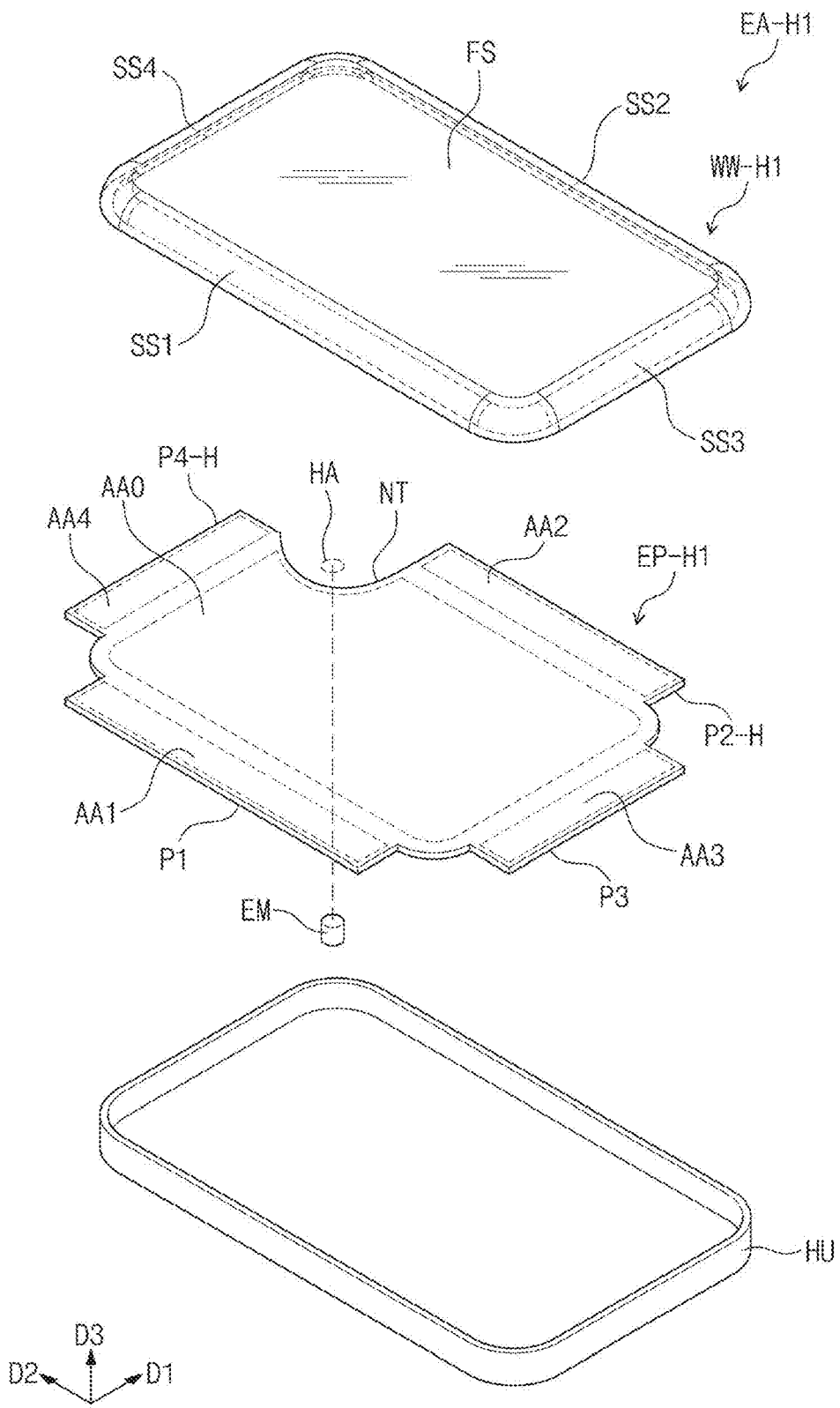
FIGS. 10A and 10B are exploded perspective views of electronic devices according to an embodiment of the inventive concept.
Figure 10B:
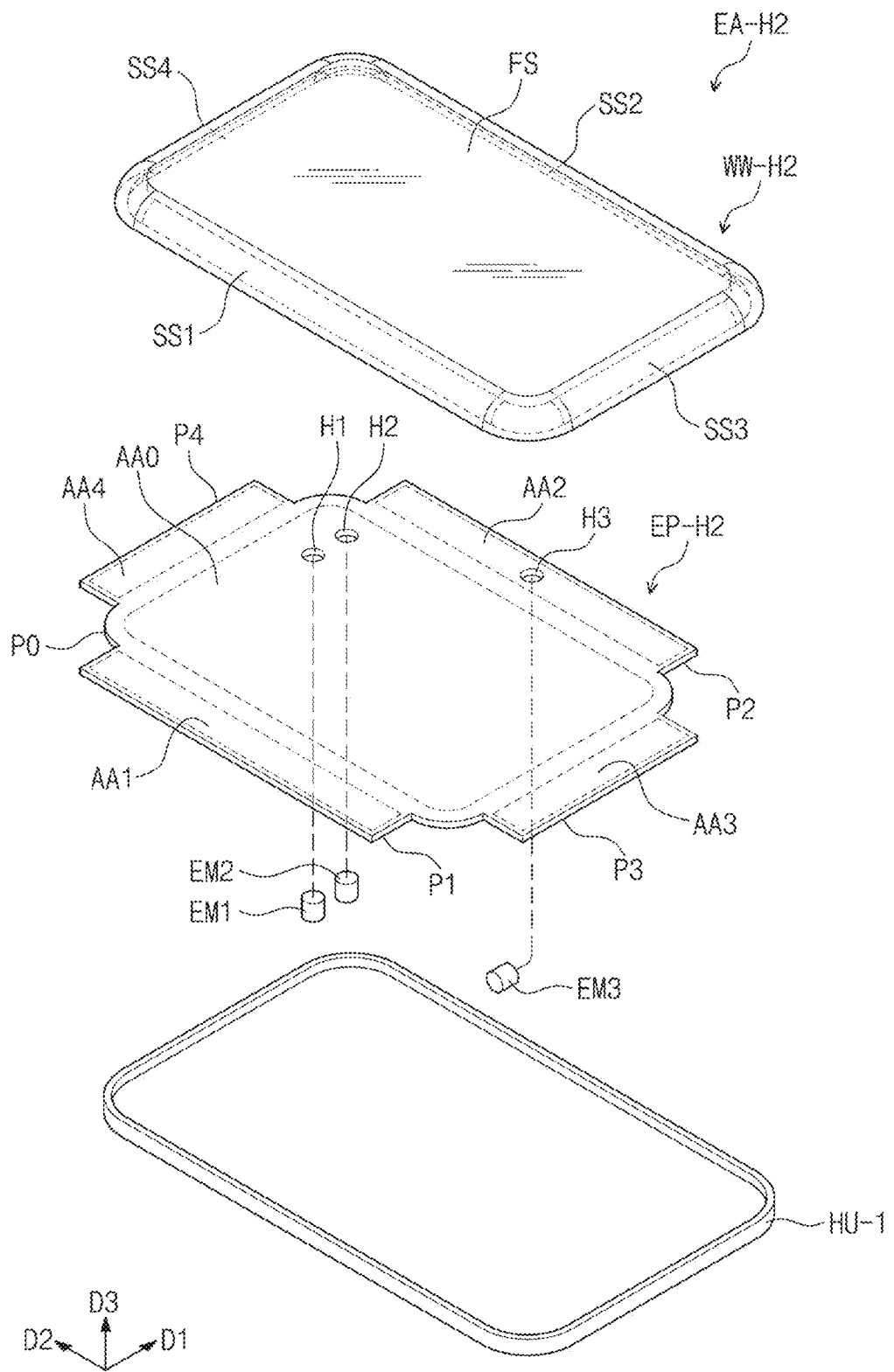

FIGS. 10A and 10B are exploded perspective views of electronic devices according to an embodiment of the inventive concept. Hereinafter, the same components as those described with reference to FIGS. 1A to 9B are given by the same reference numerals and redundant description will be omitted.

As shown in FIG. 10A, the electronic device EA-H1 may include an electronic panel EP-H1 having a partially removed shape with respect to the electronic panel EP-H shown in FIG. 8A. The electronic panel EP-H1 includes a notch part NT formed by removing a part with respect to the electronic panel EP-H shown in FIG. 8A. The notch part NT may be formed adjacent to the hole area HA overlapping with the electronic module EM. Accordingly, the main part P0-H1, the second cut-out part P2-H1, and the fourth cut-out part P4-H1 have a relatively reduced area as compared with the main part P0-H, the second cut-out part P2-H, and the fourth cut-out part P4-H, and the electronic panel EP-H1 may not overlap the electronic module EM on a plane.

The electronic device EA-H1 includes an electronic panel EP-H1 having a shape not overlapping with the electronic module EM so that it is possible to prevent or reduce optical interference that may occur between the electronic module EM and the electronic panel EP-H1.

Alternatively, as shown in FIG. 10B, the electronic device EA-H2 may further include a hole H3 defined in any of the cut-out parts P1, P2, P3, and P4. It is shown that the electronic device EA-H2 includes an electronic panel EP-H2 with a further defined third hole H3 as compared to the electronic panel EP-H shown in FIG. 8A.

According to an embodiment, the housing unit HU-1 may have a relatively low thickness as compared to the housing unit HU shown in FIG. 8A, so that the third electronic module EM3 accommodated in the housing unit HU-1 may be easily aligned with the third hole H3. The third electronic module EM3 may include at least one of a camera, a speaker, a light sensing sensor, a heat sensing sensor, or a projector, for example.

The third hole H3 of the electronic panel EP-H2 is spaced apart from the first and second holes H1 and H2 and is defined through one cut-out part, for example, a second cut-out part P2. The third electronic module EM3 constituting the electronic device EA-H2 may be arranged in a direction different from that of the first and second electronic modules EM1 and EM2. The main active area AA0 and the second sub-active area AA2 are assembled so as to face different directions in correspondence to the shape of the window WW-H2. According to an embodiment of the inventive concept, the electronic device EA-H2 may further include the third hole H3, thereby enabling the stable driving of the third electronic module EM3 through the sub-active area.

On the other hand, this is illustratively shown, and the electronic device EA-H2 may further include various numbers of holes and electronic modules corresponding thereto. For example, the electronic panel EP-H2 may include a plurality of holes defined in one sub-active area, or may include holes defined in at least two sub-active areas. Also, the holes may be omitted from the main active area AA0 and provided only to the sub-active areas AA1, AA2, AA3, and AA4. According to an embodiment of the inventive concept, the shapes and structures of the electronic devices EA-H1 and EA-H2 may be variously designed and are not limited to any one embodiment.

Figure 11A:
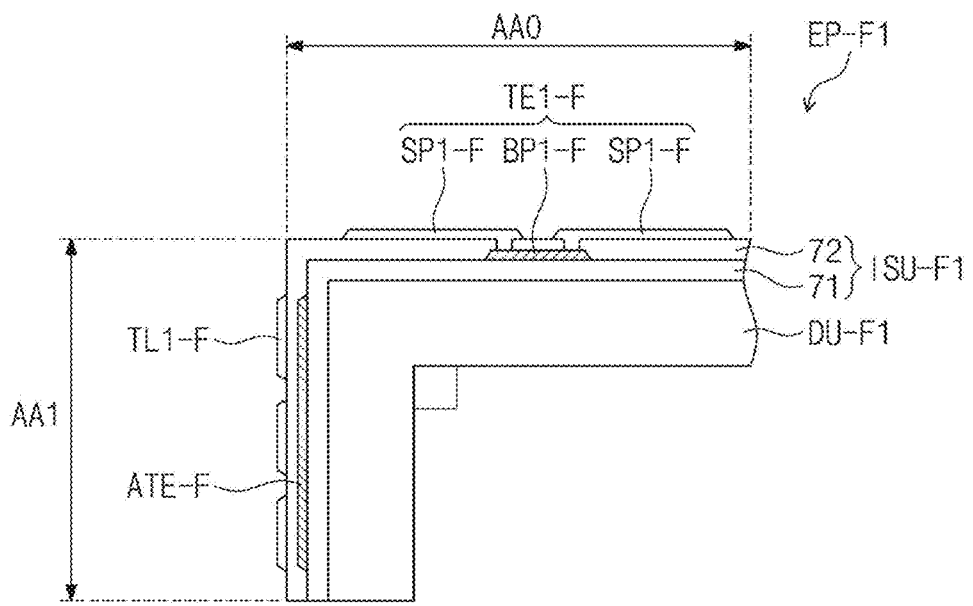
FIGS. 11A and 11B are cross-sectional views of an electronic panel according to an embodiment of the inventive concept.
Figure 11B:
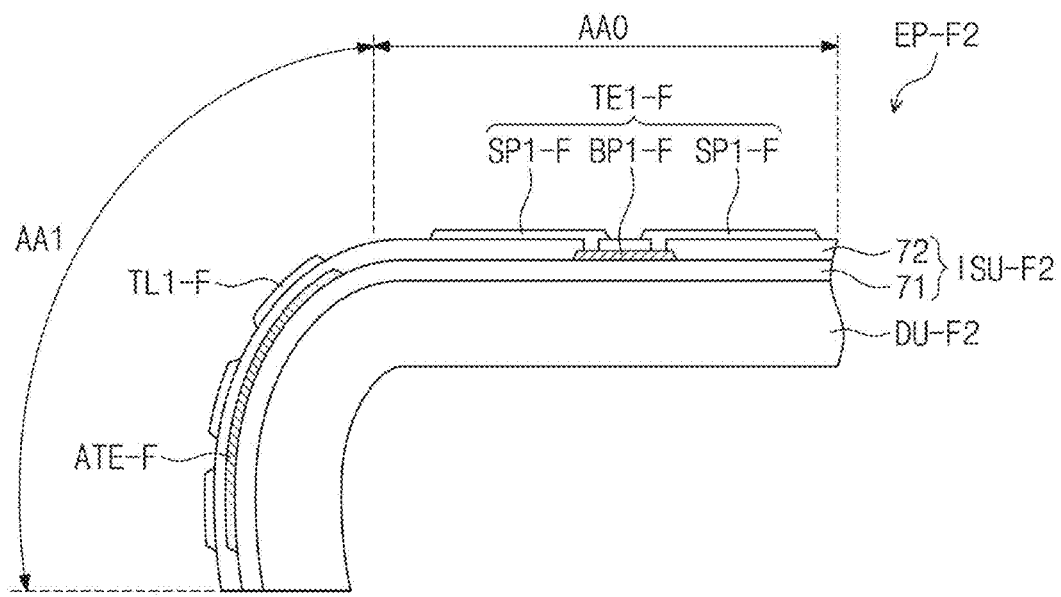

FIGS. 11A and 11B are cross-sectional views of an electronic panel according to an embodiment of the inventive concept. In FIGS. 11A and 11B, some components are omitted for ease of explanation. Hereinafter, further details of some example embodiments of the inventive concept will be described with reference to FIGS. 11A and 11B. Meanwhile, the same components as those described with reference to FIGS. 1A to 10 are given by the same reference numerals and redundant description will be omitted.

FIGS. 11A and 11B schematically show a part of the main active area AA0 and the first sub-active area AA1 of the electronic panels EP-F1 and EP-F2, and omit the configurations of the display units DU-F1 and DU-F2.

Referring to FIG. 11A, in the electronic panel EP-F1, the first sub-active area AA1 may be bent at an angle perpendicular to the main active area AA0. The electronic panel EP-F1 places first sensing lines TL1-F and first additional sensing electrodes ATE1-F in the first sub-active area AA1. Accordingly, it may be possible to secure an arrangement area of the first sensing lines TL1-F while providing a sensor for each of the main active area AA0 and the first sub-active area AA1.

Alternatively, referring to FIG. 11B, in the electronic panel EP-F2, the first sub-active area AA1 may have a curvature and may be bent from the main active area AA0. The first sensing lines TL1-F and the first additional sensing electrodes ATE1-F may be stably mounted on the curved surface.

According to an embodiment of the inventive concept, the first sub-active area AA1 may be designed in various forms such as a plane or a curved surface. The electronic panels EP-F1 and FP-F2 may easily sense an external input applied at various positions through the main active area AA0 and the first sub-active area AA1.

Figure 12A:
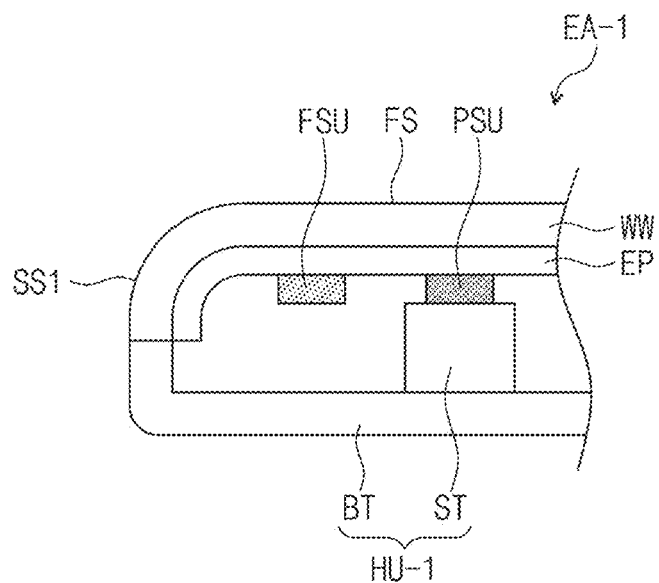
FIGS. 12A and 12B are cross-sectional views of an electronic device according to an embodiment of the inventive concept.
Figure 12B:
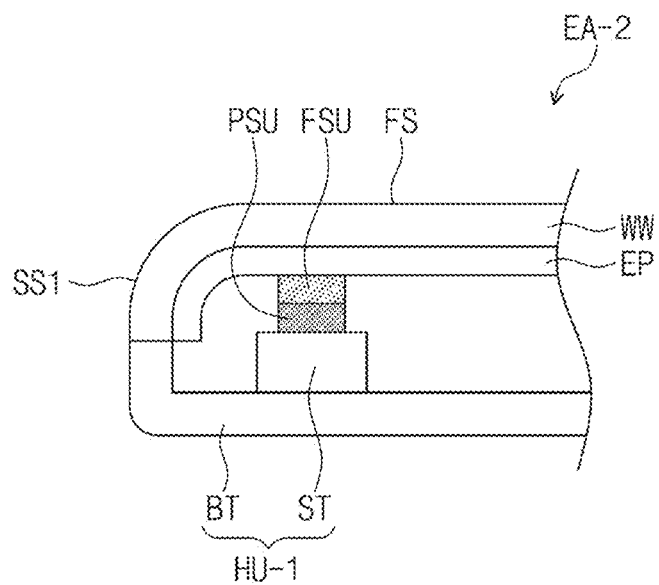

FIGS. 12A and 12B are cross-sectional views of an electronic device according to an embodiment of the inventive concept. FIGS. 12A and 12B show the combined state of the electronic device and briefly show it for ease of explanation.

As shown in FIG. 12A, the electronic device EA-1 may further include a fingerprint sensing sensor FSU and a pressure sensing sensor PSU. The fingerprint sensing sensor FSU and the pressure sensing sensor PSU may be located on the rear surface of the electronic panel EP.

The housing unit HU-1 may include a bottom part BT and a support part ST. The bottom part BT may correspond to the housing unit HU shown in FIG. 1B. The support part ST may protrude from the bottom part BT toward the rear surface of the electronic panel EP.

The fingerprint sensing sensor FSU may sense the surface curvature of the external input applied to the window WW to obtain fingerprint information of a user. The fingerprint sensing sensor FSU may be driven by optical or ultrasonic methods.

The pressure sensing sensor PSU may be arranged on a plane spaced apart from the pressure sensing sensor PSU. The pressure sensing sensor PSU is supported by the support part ST of the housing unit HU-1. The pressure sensing sensor PSU may sense the intensity of the external input through the amount of change in the third direction D3.

According to an embodiment of the inventive concept, the electronic panel EP-1 senses the external input provided on the front surface FS through the electronic panel EP. At this time, fingerprint information of the external input may be sensed through the fingerprint sensing sensor FSU, and the intensity information of the external input may be sensed through the pressure sensing sensor PSU.

Alternatively, as shown in FIG. 12B, in the electronic device EA-2, the fingerprint sensing sensor FSU and the pressure sensing sensor PSU may be overlapped and arranged on a plane. The fingerprint sensing sensor FSU and the pressure sensing sensor PSU may be stacked and located on the rear surface of the electronic panel EP and may be supported by the support part ST.

The electronic device EA-2 senses the position, intensity, and fingerprint information of the external input provided on the front surface FS. At this time, the electronic device EA-2 may simultaneously sense the intensity of the external input and the fingerprint information in the same area. According to an embodiment of the inventive concept, the fingerprint sensing sensor FSU and the pressure sensing sensor PSU may be located at various positions and are not limited to any one embodiment.

According to an embodiment of the inventive concept, it may be possible to easily sense an external input applied to various positions. Further, according to an embodiment of the inventive concept, it may be possible to secure a large area occupied by the conductive lines for transmitting the sensing signal so that occurrences of defects due to electrical interference between the conductive lines may be prevented or reduced. According to the inventive concept, an electronic panel and an electronic device with reduced bezel area and improved electrical reliability may be provided.

Although some example embodiments of the inventive concept have been described, it is understood that the inventive concept should not be limited to these example embodiments but various changes and modifications may be made by one ordinary skilled in the art within the spirit and scope of the inventive concept as defined in the following claims, and their equivalents.

What is claimed is:

1. An electronic device comprising:
   an electronic module; and
   an electronic panel having a transmitting portion exposing the electronic module, the electronic panel comprising:
   a display unit comprising a main part and a plurality of cut-out parts each protruding from the main part in a protrusion direction and bent along an intersecting direction intersecting the protrusion direction; and
   a sensor on the display unit;
   wherein the sensor comprises:
   a first sensor overlapping the main part, and comprising a main sensing electrode comprising a plurality of sensing patterns and a main sensing line overlapping at least one of the cut-out parts and connected to the main part; and
   a second sensor comprising a plurality of additional sensing electrodes overlapping the cut-out parts, and
   wherein the plurality of additional sensing electrodes are arranged along the intersecting direction in the cut-out part and overlap the main sensing line along the intersection direction.

2. The electronic device of claim 1, wherein the electronic module overlaps the main part, and
   wherein the transmitting portion is defined through the display unit and the sensor overlapping the electronic module.

3. The electronic device of claim 2, further comprising an additional electronic module overlapping at least one of the cut-out parts,
   wherein the electronic panel has an additional transmitting portion penetrating through the display unit overlapping the additional electronic module and the sensor.

4. The electronic device of claim 3, wherein the sensor further comprises a connection line connecting the sensing patterns spaced from each other with the transmitting portion therebetween, and
   wherein the connection line is overlapping the additional electronic module.

5. The electronic device of claim 1, wherein the transmitting portion is formed by removing a portion of the main part and a portion of the cut-out parts extending from the portion of the main part.

6. The electronic device of claim 1, wherein the main sensing electrode comprises a first sensing electrode comprising a first sensing pattern and a first connection pattern connecting the first sensing pattern, and a second sensing electrode comprising a second sensing pattern spaced from the first sensing pattern and a second connection pattern connecting the second sensing pattern and located at a different layer than the first connection pattern, and
   wherein the plurality of additional sensing electrode is located at a same layer as one of the first connection pattern and the second connection pattern.

7. The electronic device of claim 6, wherein the main sensing line comprises a first sensing line connected to the first sensing electrode, and a second sensing line connected to the second sensing electrode, and
   wherein the plurality of additional sensing electrode is located at a different layer than the first sensing line and the second sensing line.

8. The electronic device of claim 6, further comprising a shield electrode overlapping the main part and electrically insulated from the sensing patterns.

9. The electronic device of claim 8, wherein the shield electrode has an opening, and
   wherein the first sensing pattern is located in the opening to be connected to the first connection pattern.

10. The electronic device of claim 1, wherein the plurality of additional sensing electrode is configured as a self-capacitance type or a mutually capacitive type.

11. The electronic device of claim 1, wherein each of the cut-out parts is bent from the main part at an angle.

12. The electronic device of claim 11, wherein the angle is vertical.

13. The electronic device of claim 11, wherein each of the cut-out parts comprises a curved surface.

14. The electronic device of claim 1, wherein the display unit comprises a plurality of pixels
    wherein some of the pixels are in a main active area and other ones of the pixels are in a sub-active area.

15. The electronic device of claim 1, wherein the electronic module comprises at least one of a camera, a speaker, a light sensing sensor, a heat sensing sensor, or a projector.

16. An electronic device comprising:
    an electronic module; and
    an electronic panel having a transmitting portion exposing the electronic module, the electronic panel comprising:
    a display unit divided into a main part and a plurality of cut-out parts protruding from the main part, and the display unit comprising a base substrate, a plurality of insulating layers on the base substrate, and a plurality of pixels on the base substrate; and
    a sensor on the display unit;
    wherein the sensor comprises:
    a first sensor overlapping the main part, and comprising a main sensing electrode comprising a plurality of sensing patterns and a main sensing line overlapping at least one of the cut-out parts and connected to the main part; and
    a second sensor comprising an additional sensing electrode overlapping the cut-out parts, and
    wherein the additional sensing electrode overlaps the main sensing line, and
    wherein the display unit has a plurality of holes in which at least some of the base substrate and the plurality of insulating layers are recessed.

17. The electronic device of claim 16, wherein the display unit comprises an encapsulation layer covering the pixels and comprising a first inorganic layer, an organic layer on the first inorganic layer, and a second inorganic layer on the organic layer, and wherein the first inorganic layer and the organic layer are in a hole farthest from the transmitting portion from among the plurality of holes.

18. The electronic device of claim 17, further comprising a planarization layer located between the display unit and the sensor, and wherein the first inorganic layer, the planarization layer, and the second inorganic layer are in corresponding holes from among the plurality of holes.

19. The electronic device of claim 18, wherein the planarization layer further comprises a plurality of conductive nanoparticles.

20. The electronic device of claim 16, wherein the display unit comprises a dam part located between the holes and comprising a same material as at least one of the plurality of insulating layers.

21. The electronic device of claim 16, wherein each of the holes has a closed-line shape surrounding the transmitting portion.

\* \* \* \* \*